(12) United States Patent
Yoshikawa et al.

(10) Patent No.: US 12,007,632 B2
(45) Date of Patent: Jun. 11, 2024

(54) OPTICAL ISOLATOR AND LIGHT SOURCE DEVICE

(71) Applicant: KYOCERA Corporation, Kyoto (JP)

(72) Inventors: Hiromichi Yoshikawa, Yokohama (JP); Naoki Matsui, Tokyo (JP); Tomoya Sugita, Machida (JP)

(73) Assignee: KYOCERA Corporation, Kyoto (JP)

( * ) Notice: Subject to any disclaimer, the term of this patent is extended or adjusted under 35 U.S.C. 154(b) by 316 days.

(21) Appl. No.: 17/594,582

(22) PCT Filed: Apr. 1, 2020

(86) PCT No.: PCT/JP2020/015016
§ 371 (c)(1),
(2) Date: Oct. 22, 2021

(87) PCT Pub. No.: WO2020/217896
PCT Pub. Date: Oct. 29, 2020

(65) Prior Publication Data
US 2022/0206325 A1 Jun. 30, 2022

(30) Foreign Application Priority Data
Apr. 25, 2019 (JP) ................................. 2019-084610

(51) Int. Cl.
*G02F 1/095* (2006.01)
*G02B 6/27* (2006.01)
*H01S 5/0239* (2021.01)
*H01S 5/026* (2006.01)

(52) U.S. Cl.
CPC .......... *G02F 1/0955* (2013.01); *G02B 6/2746* (2013.01); *H01S 5/0239* (2021.01); *H01S 5/026* (2013.01)

(58) Field of Classification Search
None
See application file for complete search history.

(56) References Cited

U.S. PATENT DOCUMENTS

| | | | |
|---|---|---|---|
| 5,905,823 A | 5/1999 | Shintaku et al. | |
| 6,580,842 B1 | 6/2003 | Hehlen et al. | |
| 8,942,516 B2 | 1/2015 | He et al. | |
| 9,935,424 B2 | 4/2018 | Zheng et al. | |
| 2009/0034909 A1* | 2/2009 | Mizumoto | G02B 6/125 385/42 |
| 2013/0251299 A1 | 9/2013 | He et al. | |

FOREIGN PATENT DOCUMENTS

JP 2018-513556 A 5/2018

* cited by examiner

*Primary Examiner* — Jerry Rahll
(74) *Attorney, Agent, or Firm* — Studebaker & Brackett PC

(57) ABSTRACT

An optical isolator 10 according to the present disclosure includes a substrate 11 and an optical waveguide 12 provided on the substrate 11. The optical waveguide 12 includes a first end part 13, a plurality of second end parts 14 arranged in an array, and at least one branching part 18 located between the first end part 13 and the plurality of second end parts 14. The optical waveguide 12 has a portion having non-reciprocity and gives different non-reciprocal phase shift amounts between the first end part 13 and at least two of the second end parts 14.

13 Claims, 17 Drawing Sheets

OPTICAL ISOLATOR AND LIGHT SOURCE DEVICE

CROSS REFERENCE TO RELATED APPLICATION

This application claims priority of Japanese Patent Application No. 2019-084610 filed on Apr. 25, 2019, entire contents of which are incorporated herein by reference.

TECHNICAL FIELD

The present disclosure relates to an optical isolator and a light source device including the optical isolator.

BACKGROUND ART

In fields such as optical communication, if part of laser light emitted from a light source enters the light source as return light, there is a risk of damage to the light source, destabilization of the light source, or occurrence of noise caused by interference or the like. In view of this, an optical isolator that allows only propagation of light in one direction and prevents propagation of light in a reverse direction is used. As an optical isolator, one using a Faraday rotator having non-reciprocity is known (see, for example, Patent Literature 1).

CITATION LIST

Patent Literature

PTL 1: Japanese Unexamined Patent Application Publication (Translation of PCT Application) No. 2018-513556

SUMMARY OF INVENTION

An optical isolator according to the present disclosure includes a substrate and an optical waveguide provided on the substrate. The optical waveguide includes a first end part, a plurality of second end parts arranged in an array, and at least one branching part located between the first end part and the plurality of second end parts. The optical waveguide has a portion having non-reciprocity and gives different non-reciprocal phase shift amounts between the first end part and at least two of the second end parts.

A light source device according to the present disclosure includes an optical isolator and a light source. The optical isolator includes a substrate and an optical waveguide provided on the substrate. The optical waveguide includes a first end part, a plurality of second end parts arranged in an array, and a branching part located between the first end part and the plurality of second end parts. The optical waveguide has a portion having non-reciprocity and gives different non-reciprocal phase shift amounts between the first end part and at least two of the second end parts. The light source is disposed so that light emitted from the light source enters the first end part or the plurality of second end parts of the optical isolator.

DESCRIPTION OF EMBODIMENTS

According to an optical isolator of the related art, constituent elements such as a polarizer, a Faraday rotator, and a half-wave plate are provided in an optical waveguide through which light emitted from a light source passes or in a space between the optical waveguide and an optical transmission path such as an optical fiber. In a case where an optical isolator is provided in an optical waveguide, a connection mechanism for connecting the optical waveguide to an external optical fiber, light source, or the like is needed. It is preferable that an optical isolator is easily connectable to an optical fiber or a light source and is constituted by a smaller number of components.

Embodiments of the present disclosure are described below with reference to the drawings. The drawings used for the descriptions below are schematic drawings. Dimensional ratios and the like on the drawings are different from actual ones.

First Embodiment

As illustrated in FIGS. 1 to 4, an optical isolator 10 according to the first embodiment includes a substrate 11 and an optical waveguide 12 provided on the substrate 11.

Figure 1:
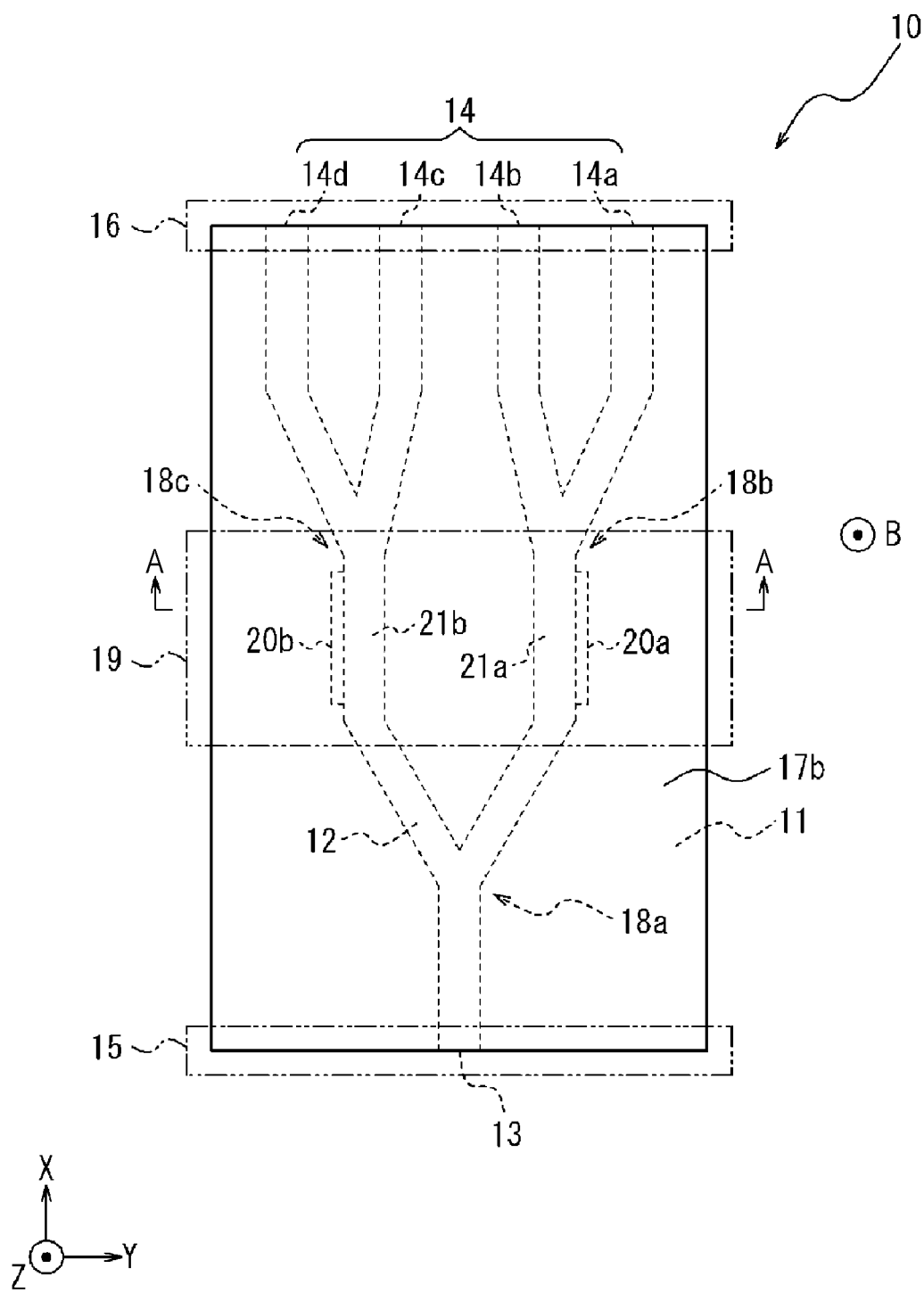
FIG. 1 is a plan view of an optical isolator according to a first embodiment.

The substrate 11 is a plate-shaped member that is long in one direction. In the following description and the drawings, an X-axis direction is a longitudinal direction of a surface of the substrate 11. A Y-axis direction is a direction orthogonal to the X-axis direction within the surface of the substrate 11. A Z-axis direction is a direction normal to the surface of the substrate 11. As illustrated in FIG. 1, the substrate 11 may be a rectangle whose adjacent two sides extend along the X-axis direction and the Y-axis direction in plan view. A shape of the substrate 11 is not limited to this.

The substrate can be made of any of various materials. For example, the substrate 11 may be made of a material selected from a group consisting of a metal conductor, a semiconductor such as silicon, glass, and a resin.

The optical waveguide 12 includes a first end part 13 located at an end in a negative direction of the X-axis along the substrate 11 and a plurality of second end parts 14a to 14d located at an end in a positive direction of the X-axis. Hereinafter, the plurality of second end parts 14a to 14d are collectively referred to as second end parts 14. The second end parts 14 are arranged in a one-dimensional array. In FIG. 1, only four second end parts 14 are illustrated for simplification. The number of second end parts 14 can be any number equal to or more than 2. For example, the number of second end parts 14 may be 20, 30, 50, or the like.

The first end part 13 constitutes a first port 15 where light is input and output. The second end parts 14 constitute a second port 16 where light is input and output. The optical waveguide 12 extends substantially along the X-axis direction between the first port 15 and the second port 16. "Light" as used herein encompasses not only light in a visible light region, but also light having any wavelength within a wavelength range from infrared radiation to ultraviolet radiation. Light that is input to the optical waveguide 12 from the first port 15 travels toward the second port 16. Light that is input to the optical waveguide 12 from the second port 16 travels toward the first port 15. The first port 15 and the second port 16 may be configured as end surfaces of the optical waveguide 12.

Figure 2:
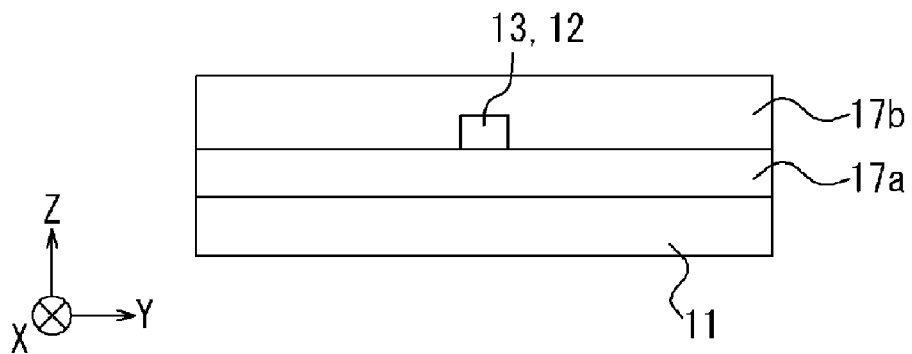
FIG. 2 is a view illustrating the optical isolator of FIG. 1 viewed from a first port side.
Figure 3:
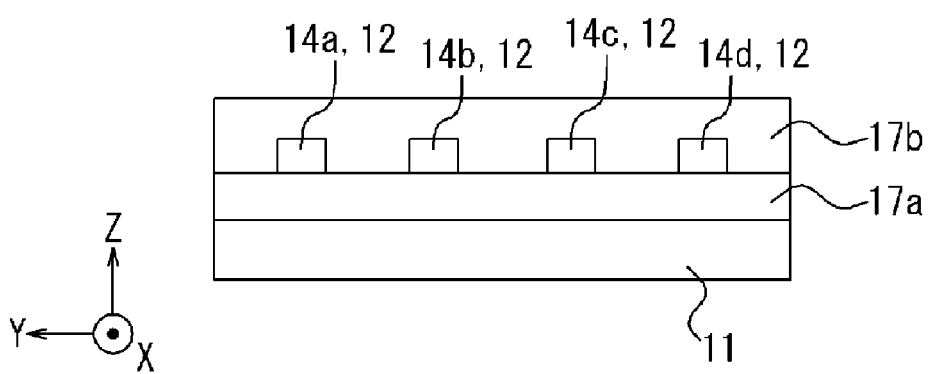
FIG. 3 is a view illustrating the optical isolator of FIG. 1 viewed from a second port side.
Figure 4:
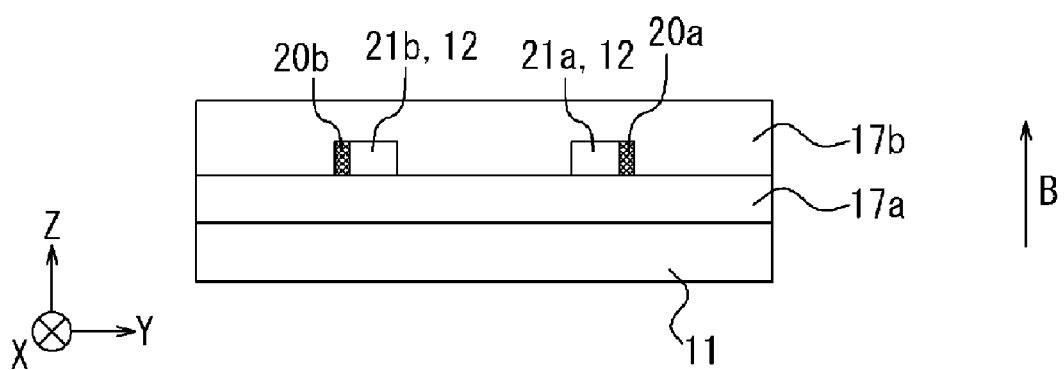
FIG. 4 is a sectional view taken along line A-A of FIG. 1.

As illustrated in FIGS. 2 to 4, the optical waveguide (the first end part 13 thereof is illustrated in FIG. 2 and the second end parts 14 thereof are illustrated in FIG. 3) is covered with a first medium 17a and a second medium 17b along a direction in which the optical waveguide 12 extends. The first medium 17a is provided on the substrate 11. In a case where the substrate 11 is a dielectric body, the substrate 11 may also serve as the first medium 17a. The first medium 17a and the second medium 17b are in contact with an outer periphery of the optical waveguide 12. The optical waveguide 12, the first medium 17a, and the second medium 17b are dielectric bodies. The optical waveguide 12 has higher permittivity than the first medium 17a and the second medium 17b. The first medium 17a and the second medium 17b may be the same medium. The first medium 17a and the second medium 17b may be unified as a single medium.

The first medium 17a and the second medium 17b are, for example, made of quartz glass (silicon dioxide: $SiO_2$). The optical waveguide 12 is, for example, made of silicon (Si). Relative permittivity of silicon and relative permittivity of quartz glass are approximately 12 and approximately 2, respectively. Silicon allows near-infrared light of approximately 1.2 μm to approximately 6 μm to propagate at low loss. This allows large part of light that enters from the first end part 13 or the second end parts 14 to propagate inside the optical waveguide 12. In a case where the optical waveguide 12 is made of silicon, the optical waveguide 12 allows infrared light having a wavelength of a 1.3 μm band or a 1.55 μm band used for optical communication to propagate at low loss. The optical waveguide 12 is, in other words, a core. The first medium 17a and the second medium 17b are, in other words, clads.

Materials for the optical waveguide 12 and the first medium 17a and the second medium 17b are not limited to the materials described above. Some of the first medium 17a and the second medium 17b, for example, part of the second medium 17b may be air. That is, the optical waveguide 12 alone may be provided on the first medium 17a made of quartz glass.

The optical waveguide 12 has one or more branching parts 18 between the first end part 13 and the plurality of second end parts 14. Each of the branching parts 18 divides a single path that forms part of the optical waveguide 12 on the first end part 13 side into two or more paths on the second end parts 14 side. For example, each of the branching parts 18 can be a Y-branching optical waveguide that divides a single path into two paths. Each of the branching parts 18 unifies a plurality of paths on the second end parts 14 side of the optical waveguide 12 into a single path on the first end part 13 side. The branching parts 18 may be disposed in multiple stages between the first end part 13 and the second end parts 14. Each of the branching parts 18 can divide light entering from a path on the first end part 13 side of the optical waveguide 12 into light of substantially equal amounts passing through a plurality of paths on the second end parts 14 side. Each of the branching parts 18 can merge light entering from a plurality of paths on the second end parts 14 side of the optical waveguide 12 into light passing through a path on the first end part 13 side.

In the example of FIG. 1, the optical waveguide 12 has a first branching part 18a, a second branching part 18b, and a third branching part 18c. The first branching part 18a is located between the first end part 13 and the second and third branching parts 18b and 18c. The second branching part 18b is located between the first branching part 18a and the second end parts 14a and 14b. The third branching part 18c is located between the first branching part 18a and the second end parts 14c and 14d. The number of branching parts 18 is not limited to three, and any number of branching parts 18 are provided according to the number of second end parts 14. The first branching part 18a, the second branching part 18b, and the third branching part 18c are collectively referred to as branching parts 18 as appropriate.

At each of the branching parts 18 illustrated in FIG. 1, a path on the first end part 13 side of the optical waveguide 12 is physically continuous with two paths on the second end parts 14 side. The path on the first end part 13 side and the paths on the second end parts 14 side of the optical waveguide 12 at each of the branching parts 18 need not be physically continuous as long as these paths are optically coupled through portions that are close and parallel like a known optical directional coupler. In a case where paths of the optical waveguide 12 are disposed close to each other, light transfer occurs between the path on the first end part 13 side and the paths on the second end parts 14 side due to evanescent waves.

The optical waveguide 12 includes a portion having non-reciprocity. The portion of the optical waveguide 12 that has non-reciprocity is also referred to as a phase shifter 19. The phase shifter 19 is provided in any part on the optical waveguide 12 between at least one branching part 18 and the second end parts 14. "Having non-reciprocity" means that an effect on light propagating through the optical waveguide 12 varies depending on a propagation direction of the light. The propagation direction of the light includes a first direction from the first end part 13 toward the second end parts 14 and a second direction from the second end parts 14 toward the first end part 13. In the phase shifter 19, a non-reciprocal phase shifting effect occurs in which light propagating in the first direction and light propagating in the second direction are different in amount of change of a phase due to a magneto-optical effect. An amount of change of a phase is referred to as a phase shift amount. The phase shifter 19 gives a non-reciprocal phase shift amount between the first end part 13 and the second end parts 14.

The phase shifter 19 includes a first non-reciprocal member 20a and a second non-reciprocal member 20b each of which has non-reciprocity. Hereinafter, the first non-reciprocal member 20a and the second non-reciprocal member 20b are sometimes collectively referred to as non-reciprocal members 20. The non-reciprocal members 20 are disposed in planar contact with part of the optical waveguide 12. "Disposed in contact" as used herein encompasses being joined by any means. The non-reciprocal members 20 may, for example, contain a non-reciprocal material such as magnetic garnet, ferrite, iron, or cobalt. The non-reciprocal members 20 generate a non-reciprocal phase shifting effect on light propagating through the portions of the optical waveguide 12 that are in contact with the non-reciprocal members 20.

The phase shifter 19 includes a first non-reciprocal path 21a between the first branching part 18a and the second branching part 18b and a second non-reciprocal path 21b between the first branching part 18a and the third branching part 18c. The first non-reciprocal path 21a and the second non-reciprocal path 21b are part of the optical waveguide 12. The first non-reciprocal member 20a and the second non-reciprocal member 20b are disposed in contact with the first non-reciprocal path 21a and the second non-reciprocal path 21b, respectively. Portions where the first non-reciprocal member 20a and the second non-reciprocal member 20b are in contact with one side surface of the optical waveguide 12 are referred to as the first non-reciprocal path 21a and the second non-reciprocal path 21b, respectively. Hereinafter, the first non-reciprocal path 21a and the second non-reciprocal path 21b are sometimes collectively referred to as non-reciprocal paths 21. The non-reciprocal paths 21 are portions of the optical waveguide 12 that have non-reciprocity.

In the sectional view of FIG. 4, an area of each non-reciprocal member 20 is equal to or less than a half of an area of a corresponding non-reciprocal path 21. That is, a volume of each non-reciprocal member 20 is equal to or less than a half of a volume of a corresponding non-reciprocal path 21.

The optical waveguide 12 is configured to propagate light in a single mode. An increase in a volume of the non-reciprocal members 20 disposed in contact with the optical waveguide 12 may generate an undesirable mode in the optical waveguide 12, thereby degrading transmission characteristics of the optical waveguide 12. The non-reciprocal members 20 are preferably small so as not to affect a mode of light propagating through the optical waveguide 12. By making the volume of each non-reciprocal member 20 equal to or less than the volume of a corresponding non-reciprocal path 21, degradation of the transmission characteristics can be reduced or suppressed.

The first non-reciprocal member 20a can be disposed in contact with a side surface, on a positive side in the Y-axis direction, of a portion (i.e., the first non-reciprocal path 21a) of the optical waveguide 12 between the first branching part 18a and the second branching part 18b. The second non-reciprocal member 20b can be disposed in contact with a side surface, on a negative side in the Y-axis direction, of a portion (i.e., the second non-reciprocal path 21b) of the optical waveguide 12 between the first branching part 18a and the third branching part 18c.

A magnetization direction of the non-reciprocal members 20 or a direction of an external magnetic field that generates non-reciprocity in the non-reciprocal members 20 and a polarization direction of incident light entering the optical waveguide 12 are substantially orthogonal to each other.

Specifically, the polarization direction of incident light entering the optical waveguide 12 is substantially parallel (i.e., the Y-axis direction) with a surface (substrate surface) of the substrate 11. In this case, as illustrated in FIG. 4, the first non-reciprocal member 20a and the second non-reciprocal member 20b generate different non-reciprocal phase shifting effects on the optical waveguide 12 by application of an external magnetic field having a component in the Z-axis direction. In other words, the first non-reciprocal path 21a and the second non-reciprocal path 21b have different non-reciprocal phase shift amounts. In a case where a magnitude of the external magnetic field is constant, a non-reciprocal phase shift amount is largest when the external magnetic field is applied in a substantially Z-axis direction.

In a case where the first non-reciprocal member 20a and the second non-reciprocal member 20b are ferromagnetic bodies, the first non-reciprocal path 21a and the second non-reciprocal path 21b have a non-reciprocal phase shifting effect even without application of an external magnetic field. In a case where the polarization direction of light entering the optical waveguide 12 is the Y-axis direction, the first non-reciprocal member 20a and the second non-reciprocal member 20b are disposed so that the magnetization direction has a component in the Z-axis direction. The first non-reciprocal member 20a and the second non-reciprocal member 20b may be disposed so that the magnetization direction becomes a substantially Z-axis direction.

For example, it is assumed that a difference of +90° in phase shift amount is generated between light propagating through the first non-reciprocal path 21a in the first direction and light propagating through the first non-reciprocal path 21a in the second direction. Furthermore, it is assumed that a difference of −90° in phase shift amount is generated between light propagating through the second non-reciprocal path 21b in the first direction and light propagating through the second non-reciprocal path 21b in the second direction.

Light entering the optical waveguide 12 from the first end part 13 is divided at the first branching part 18a. The divided light propagates through the first non-reciprocal path 21a and the second non-reciprocal path 21b. The light propagating through the first non-reciprocal path 21a is divided at the second branching part 18b and is output from the second end parts 14a and 14b. The light propagating through the second non-reciprocal path 21b is divided at the third branching part 18c and is output from the second end parts 14c and 14d. Light entering from the first end part 13 and output from the second end parts 14 can be caused to have the same phase, for example, by adjusting a length of the optical waveguide 12 from the first end part 13 to the second end parts 14. In this case, light output from the plurality of second end parts 14 is output as a light beam having directivity in a narrow angular range in the X-axis direction, in which phases are aligned, due to a principle similar to a phased array antenna.

Meanwhile, light entering from the second end parts 14a and 14b is merged at the second branching part 18b and propagates through the first non-reciprocal path 21a. Light entering from the second end parts 14c and 14d is merged at the third branching part 18c and propagates through the second non-reciprocal path 21b. The light propagating through the first non-reciprocal path 21a and the light propagating through the second non-reciprocal path 21b are merged at the first branching part 18a and is then output from the first end part 13. A phase difference of 180° can occur between the light propagating through the first non-reciprocal path 21a and the light propagating through the second non-reciprocal path 21b due to non-reciprocity of the first non-reciprocal path 21a and the second non-reciprocal path 21b. Accordingly, an intensity of light entering the second end parts 14 from a positive side toward a negative side of the X-axis, propagating through the optical isolator 10 in the second direction, and being output from the first end part 13 is much weaker than a sum of intensities of light entering from the plurality of second end parts 14. That is, light entering the second end parts 14 in a negative direction of the X-axis and the optical waveguide 12 are not easily coupled.

Accordingly, in the optical isolator 10, light travelling in the first direction is easy to propagate, and light travelling in the second direction is not easy to propagate.

In the example illustrated in FIGS. 1 to 4, four second end parts 14 are provided, and two portions of the optical waveguide 12 have non-reciprocity for simplification. However, in a case where a large number of second end parts 14 that are different in non-reciprocal phase shift amount between the second end parts 14 and the first end part 13 are provided, light travelling in the second direction is further not easy to be coupled with the optical waveguide 12 at the second end parts 14. Meanwhile, by making phase shift amounts of light propagating from the first end part 13 to the second end parts 14 uniform, directivity of light propagating through the optical isolator 10 in the first direction and being output from the second end parts 14 is further increased.

Figure 5:
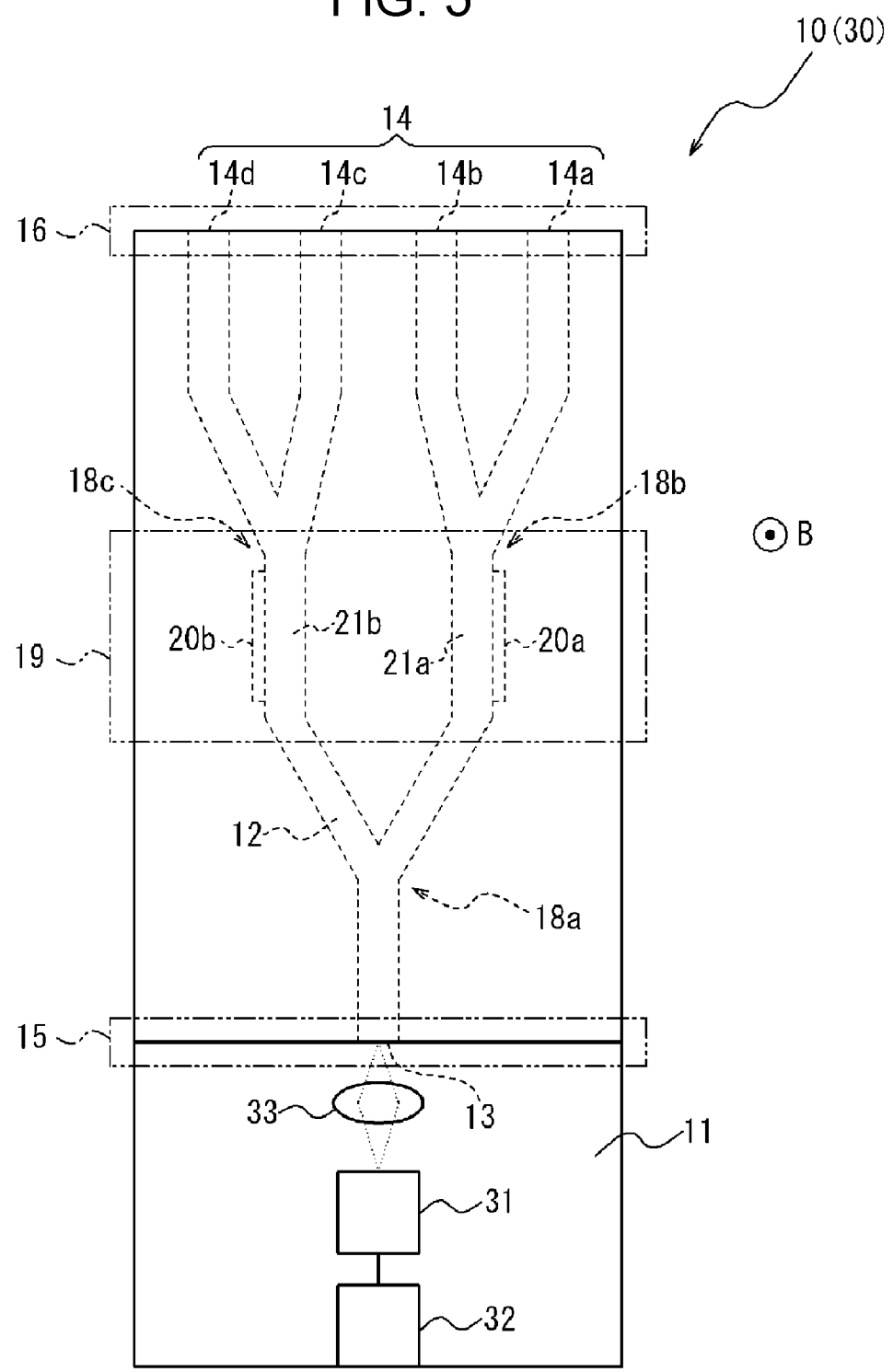
FIG. 5 is a plan view of a light source device including the optical isolator of FIG. 1.
Figure 6:
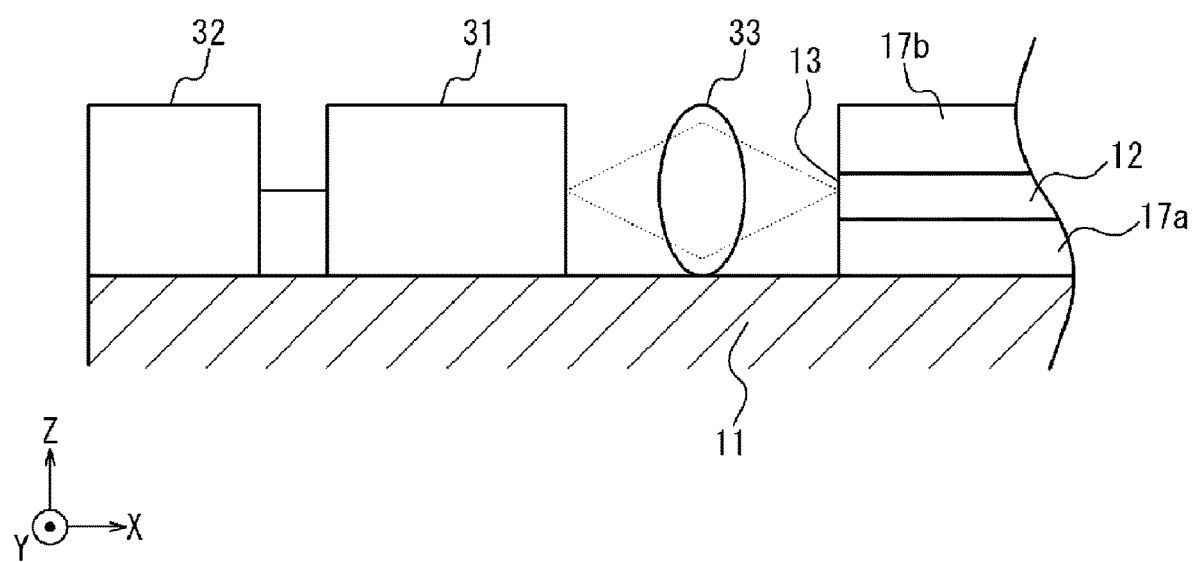
FIG. 6 is a sectional view illustrating a light source of FIG. 5 and a vicinity of a first end part of the optical isolator.

The first port 15 can be a port on a light incident side. The optical isolator 10 can be used in combination with a configuration for input of light. The optical isolator 10 and the configuration for input of light can be combined to constitute a light source device 30. As illustrated in FIGS. 5 and 6, the light source device 30 includes the optical isolator 10, a light source 31, a power supply 32 that supplies power to the light source 31, and a lens 33. The light source 31 can be, for example, a semiconductor laser such as a laser diode (LD) or a vertical cavity surface emitting laser (VCSEL).

The light source 31 is optically coupled to the first end part 13 of the optical waveguide 12 through the lens 33. A positional relationship among the light source 31, the lens 33, and the first end part 13 of the optical waveguide 12 may be fixed so that displacement does not occur. The light source 31 and the lens 33 may be integrated on the substrate 11 together with the optical waveguide 12 and the medium 17. The light source 31 may cause light linearly polarized so that a polarization direction becomes the Y-axis direction to enter the first port 15. The light source device 30 may be configured not to include the lens 33. In a case where the light source device 30 does not include the lens 33, light emitted from the light source 31 may be directly input to the first end part 13.

A method of input of light from the light source 31 to the first end part 13 of the optical waveguide 12 is not limited to the method of causing light of the light source 31 to be input directly or through the lens 33. The light source 31 may be coupled to the first end part 13 through an optical fiber. Examples of a method for causing light propagating through the optical fiber to be input to the first end part 13 may include various methods such as a method of connecting a free space through a lens or the like, a method of directly joining an emission surface of the optical fiber and the first end part 13, and a method using a connection waveguide.

The light source device 30 includes the light source 31 and the optical isolator 10, and thus light emitted from the light source 31 propagates through the optical isolator 10 in the first direction. Meanwhile, the light source device 30 reduces or suppresses light returning in the second direction by the optical isolator 10, and thus the light source 31 is not easily influenced by the return light.

Figure 7:
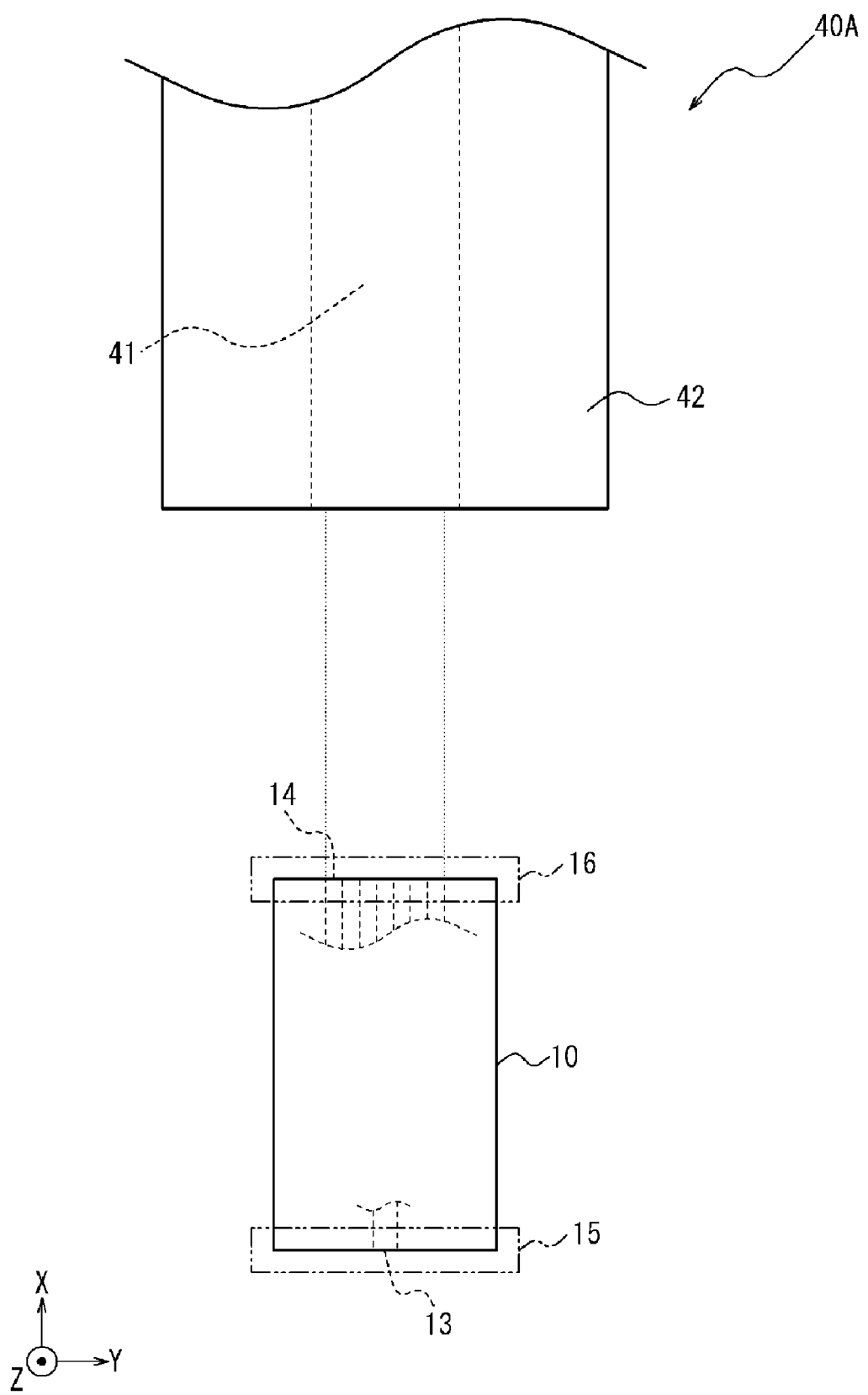
FIG. 7 is a plan view illustrating an example of a connection form between the optical isolator of FIG. 1 and an optical transmission path.

As illustrated in FIG. 7, the second port 16 including the second end parts 14 of the optical isolator 10 is optically coupled to an optical transmission path 40A. The optical transmission path 40A is a path for light transmission. Specifically, the optical transmission path 40A can be an optical fiber having a core 41 and a clad 42. The second port 16 of the optical isolator 10 and the core 41 of the optical transmission path 40A face each other with a space interposed therebetween in the X-axis direction. Light output from the second port 16 and travelling in the X-axis direction is coupled with the core 41 with high coupling efficiency. A core diameter of the optical transmission path 40A of FIG. 7 is larger than a dimension of a cross section of the optical waveguide 12. The core diameter of the optical transmission path 40A of FIG. 7 can be, for example, approximately 50 μm. The optical transmission path 40A allows transmission of light emitted from the optical isolator 10 in multiple modes.

Figure 8:
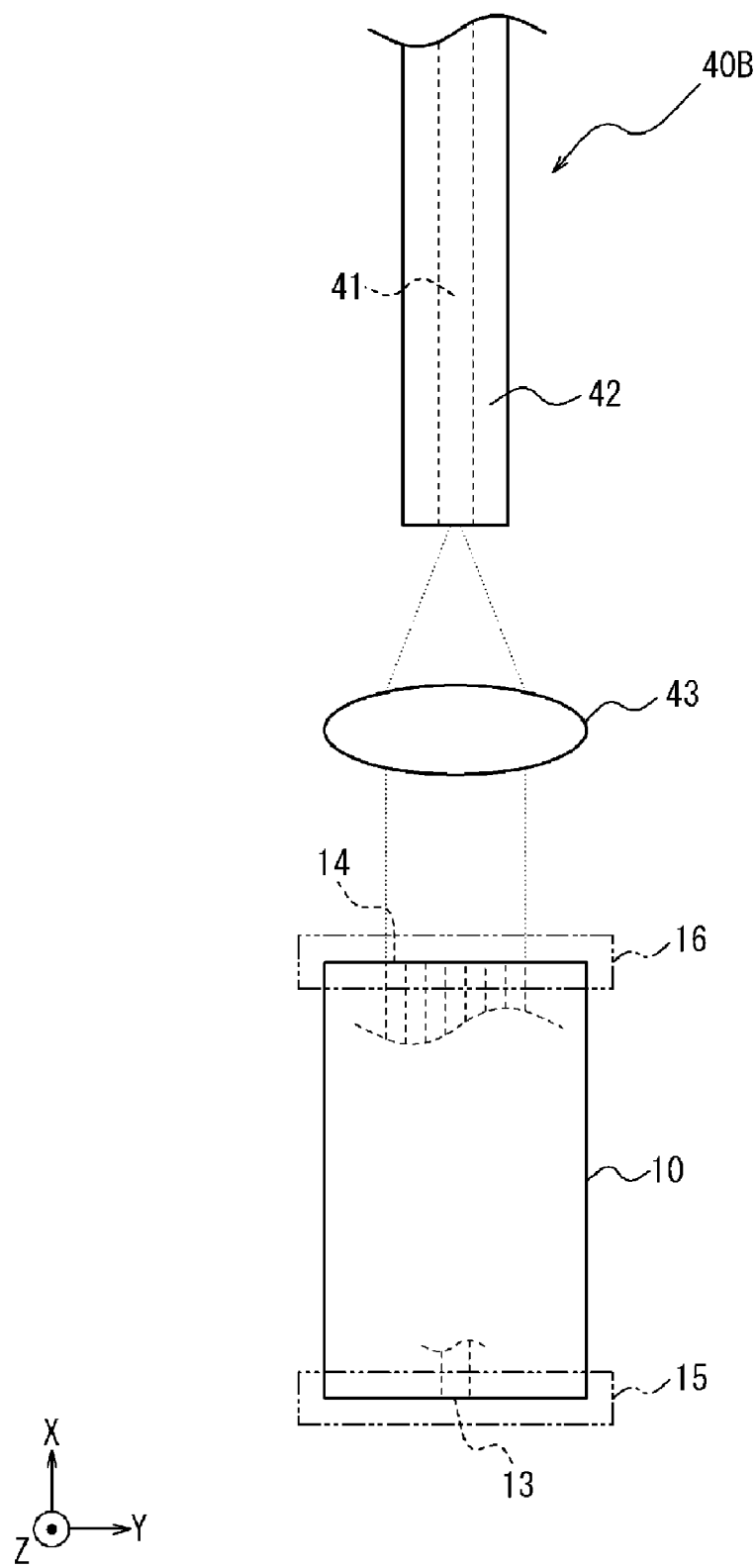
FIG. 8 is a plan view illustrating another example of a connection form between the optical isolator of FIG. 1 and an optical transmission path.

In another embodiment, the second port 16 of the optical isolator 10 may be optically coupled to a core 41 of an optical transmission path 40B through a lens 43, as illustrated in FIG. 8. Light output from the second end parts 14 of the optical isolator 10 may be focused on an end surface of the core 41 of the optical transmission path 40B that is a single-mode optical fiber by the lens 43 disposed in a space and then enter the optical transmission path 40B. In this case, a core diameter of the optical transmission path 40B can be, for example, approximately 10 μm.

Figure 9:
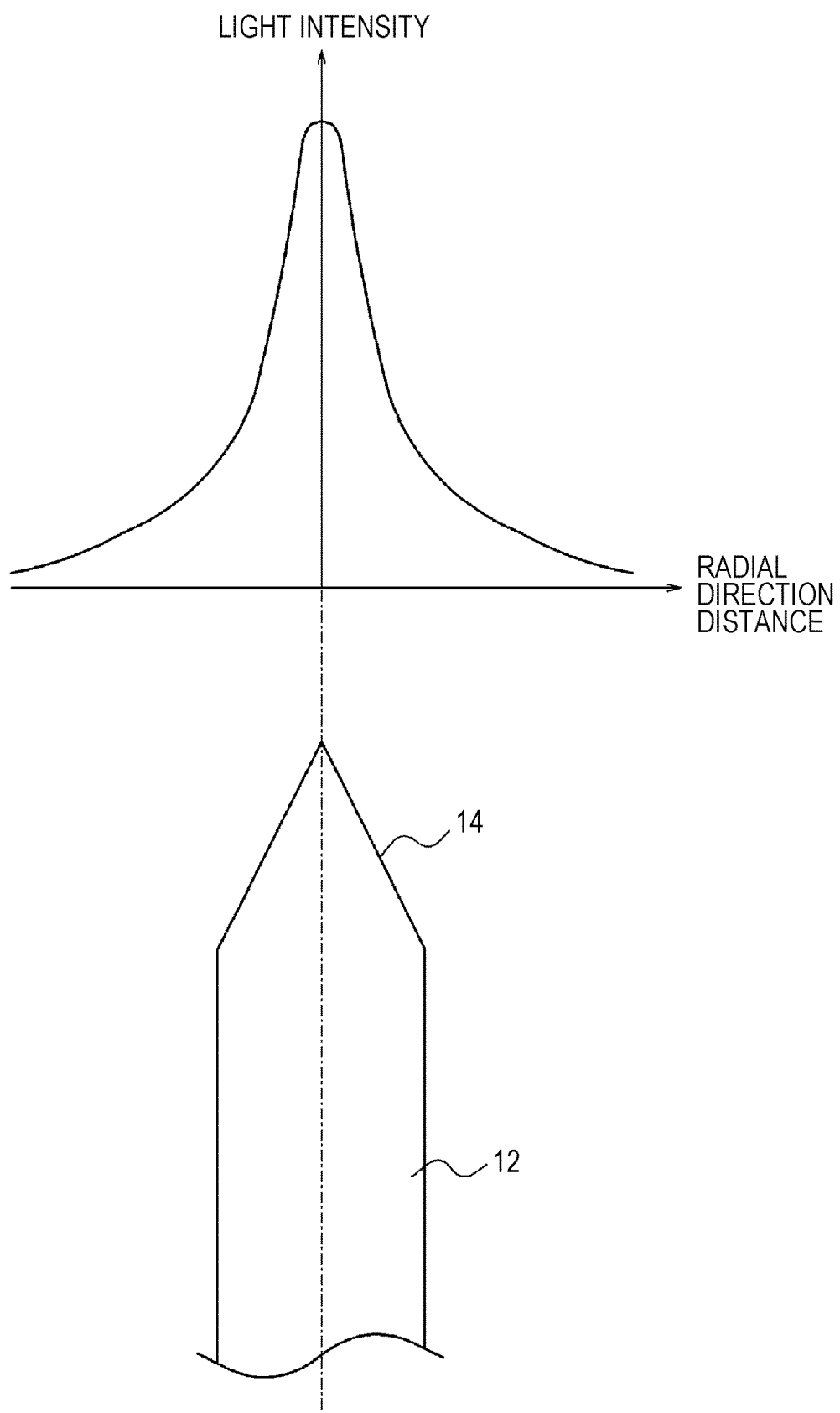
FIG. 9 illustrates a shape of an end surface of a second end part of the optical waveguide and an intensity distribution of output light.

Ends of the second end parts 14 of the optical waveguide 12 can have end surfaces tapered in a longitudinal direction (i.e., the X-axis direction) of the optical waveguide 12. FIG. 9 illustrates a shape (lower side in FIG. 9) of end surfaces of the second end parts 14 of the optical waveguide 12 and an example of an intensity distribution (upper side in FIG. 9) of output light in a radial direction. The end surfaces of the second end parts 14 have substantially cone-shaped side surfaces. In another embodiment, the end surfaces of the second end parts 14 may have a semispherical shape protruding in the X-axis direction. The end surfaces of the second end parts 14 of the optical waveguide 12 can have a shape that is longer than a wavelength of light propagating in the X-axis direction and is gradually tapered in a positive direction of the X-axis. In a case where the end surfaces of the second end parts 14 of the optical waveguide 12 are tapered in the longitudinal direction of the optical waveguide 12, an intensity of light output from the individual second end parts 14 increases.

Figure 10:
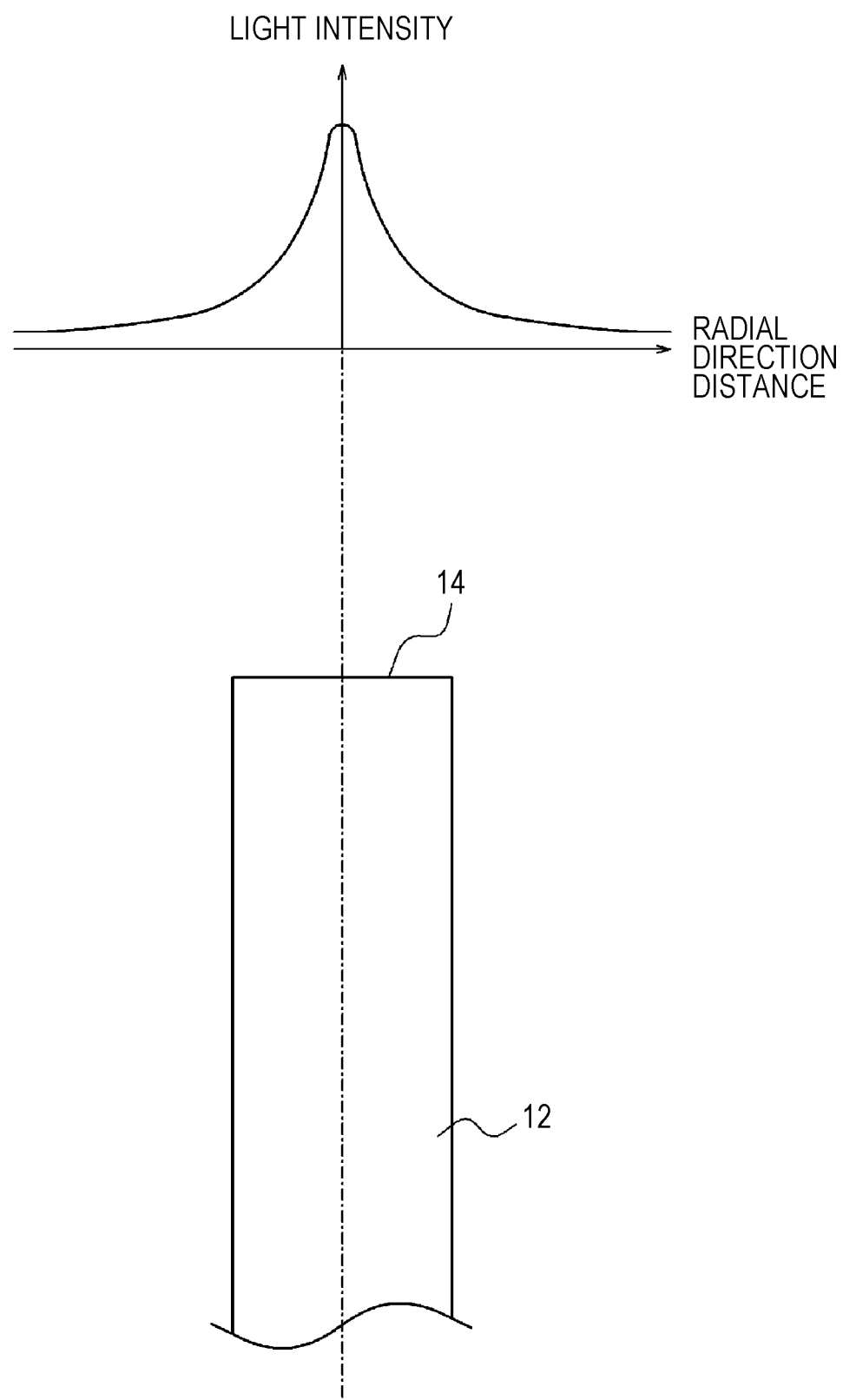
FIG. 10 illustrates a shape of an end surface of a second end part of the optical waveguide in a case where the end surface has a flat shape and an intensity distribution of output light.

FIG. 10 illustrates, for comparison, a shape (lower side in FIG. 10) of the end surfaces of the second end parts 14 of the optical waveguide 12 in a case where the end surfaces are flat and an example of an intensity distribution (upper side in FIG. 10) of output light. In this case, larger part of single-mode light that has propagated through the optical waveguide 12 is reflected by the flat end surfaces of the second end parts 14 than in a case where the second end parts 14 have tapered end surfaces of FIG. 9. Accordingly, an intensity of light output from the second end parts 14 having flat end surfaces of FIG. 10 is weaker than an intensity of light output from the second end parts 14 having tapered end surfaces of FIG. 9.

In both FIGS. 7 and 8, the optical transmission paths 40A and 40B receive light traveling with directivity in the X-axis direction from the second end parts 14. Phases of light output from the second port 16 of the optical isolator 10 are aligned at the second end parts 14, and therefore the output light has high directivity in the X-axis direction. Furthermore, in a case where the second end parts 14 have tapered end surfaces, an intensity of light output from the second port 16 of the optical isolator 10 is further increased. This allows the light output from the second port 16 of the optical isolator 10 to be coupled with the optical transmission path 40A or 40B with high coupling efficiency. Meanwhile, as for light entering the second port 16 of the optical isolator 10 from the optical transmission path 40A or 40B side, light propagating from the second end parts 14 to the first end part 13 is different in phase shift amount due to non-reciprocity of the optical waveguide 12. This breaks a condition for making phases of the return light identical at the first end part 13, and thus it is difficult for return light entering the second port 16 to be coupled with the optical waveguide 12 of the optical isolator 10.

As described above, the optical isolator 10 includes the optical waveguide 12 on the substrate 11, and the non-reciprocal members 20 having non-reciprocity are disposed in contact with the optical waveguide 12 to give different non-reciprocal phase shift amounts between the first end part 13 and the plurality of second end parts 14. With this configuration, the optical isolator 10 can have a function of an optical isolator that allows propagation of light in the first direction and reduces or suppresses propagation of light in the second direction.

Furthermore, the optical isolator 10 can be easily connected to the optical transmission path 40 since directivity of light output from the second port 16 is high. Accordingly, the optical isolator 10 can be connected to the optical transmission path 40 by using a smaller number of components than in a case where an independent optical isolator is provided inside the optical waveguide 12 or in a space.

Furthermore, the optical isolator 10 according to the present embodiment can function as an isolator even in a case where the non-reciprocal phase shift amounts are small, by making an angle of a beam connecting the second port 16 and the optical transmission path 40 fall within a narrow angular range in the X-axis direction. In other words, even in a case where a difference in non-reciprocal phase shift amount among light in the second direction entering the second end parts 14 is small, the optical isolator 10 can be given a function as an isolator by breaking the condition for making phases of light entering from the second end parts 14 identical at the first end part 13.

Specifically, in the above description, it is assumed that in a case where light propagates in the second direction, a phase difference of 180° occurs between light propagating through the first non-reciprocal path 21a and light propagating through the second non-reciprocal path 21b due to non-reciprocity of the first non-reciprocal path 21a and the second non-reciprocal path 21b. However, this phase difference may be a value other than 180°, for example, may be a value such as 120° or 90°. Even in such a case, light propagating in the second direction and then output from the first end part 13 is markedly reduced. Furthermore, in such a case, the second port 16 of the optical isolator 10 has a reception intensity distribution that expands in an angular direction within an XY plane rather than in a negative direction of the X-axis, depending on a phase difference occurring due to the phase shifter 19, layout of the plurality of second end parts 14, and the like. Accordingly, the optical isolator 10 has an effect of reducing or suppressing light entering the second port 16 in the negative direction of the X-axis.

In the optical isolator 10 according to the present embodiment, lengths of portions of the non-reciprocal members 20 that are in contact with the optical waveguide 12 can be made relatively short since non-reciprocal phase shift amounts can be reduced. This can reduce a loss of the optical waveguide 12 resulting from the lengths of the non-reciprocal members 20.

Furthermore, since the light source device 30 according to the present embodiment has the optical isolator 10, it is possible to prevent return light of light emitted from the light source 31 from entering the light source 31 and damaging the light source 31, from destabilizing the light source 31, or from generating noise or the like.

In the first embodiment, the first non-reciprocal member 20a and the second non-reciprocal member 20b are disposed in contact with two portions of the optical waveguide 12 to form the first non-reciprocal path 21a and the second non-reciprocal path 21b, which are two portions having non-reciprocity. However, even in a case where either the first non-reciprocal path 21a or the second non-reciprocal path 21b is not provided, the effects of the present embodiment can be obtained since a change occurs in relationship in phase shift amount between a case where light propagates in the first direction and a case where light propagates in the second direction.

Second Embodiment

Figure 11:
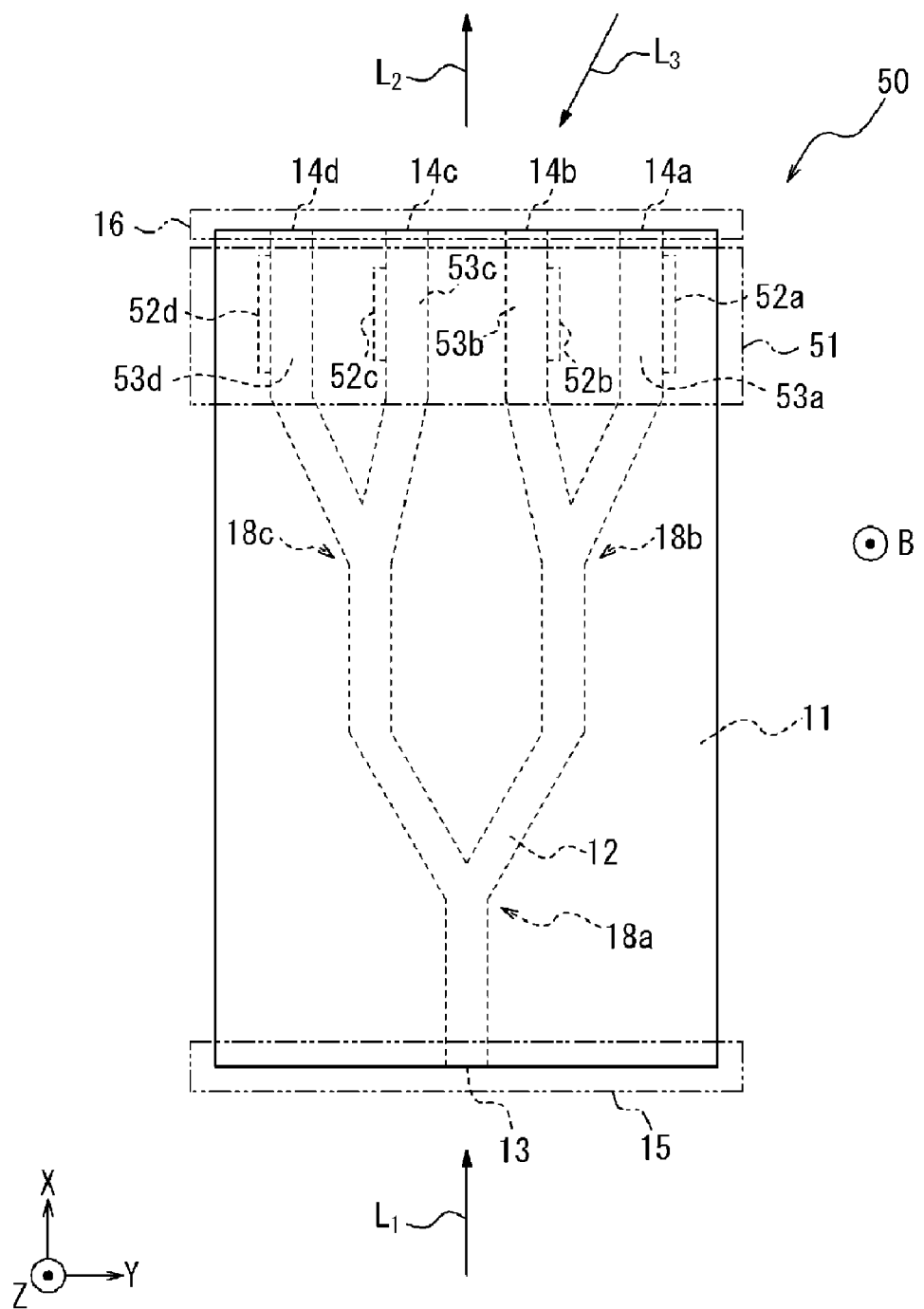
FIG. 11 is a plan view of an optical isolator according to the second embodiment.

An optical isolator 50 according to a second embodiment is described with reference to FIG. 11. FIG. 11 is a plan view of the optical isolator 50. The optical isolator 50 is similar to the optical isolator 10 according to the first embodiment, and therefore constituent elements identical or similar to those of the optical isolator 10 are given identical reference signs, and description thereof is omitted as appropriate.

A shape of an optical waveguide 12 of the optical isolator 50 is similar to the shape of the optical waveguide 12 according to the first embodiment. In the optical isolator 50, a phase shifter 19 is not provided between a first branching part 18a and second and third branching parts 18b and 18c of the optical waveguide 12, unlike the first embodiment. Instead, a portion between the second and third branching parts 18b and 18c of the optical waveguide 12 and second end parts 14a to 14d is a phase shifter 51 having non-reciprocity. The phase shifter 51 gives different non-reciprocal phase shift amounts between the first end part 13 and the second end parts 14.

The phase shifter 51 includes non-reciprocal members 52a to 52d having non-reciprocity. Hereinafter, the non-reciprocal members 52a to 52d are sometimes collectively referred to as non-reciprocal members 52. The non-reciprocal members 52 are disposed in planar contact with part of the optical waveguide 12. The non-reciprocal members 52 generate a non-reciprocal phase shifting effect on light propagating through the optical waveguide 12. The non-reciprocal members 52a to 52d are in contact with portions of the optical waveguide 12 that lead to the second end parts 14a to 14d, respectively. The portions of the optical waveguide 12 with which the non-reciprocal members 52a to 52d are in contact are non-reciprocal paths 53a to 53d, respectively. The non-reciprocal paths 53a to 53d are sometimes collectively referred to as non-reciprocal paths 53.

The non-reciprocal members 52a and 52b are in contact with side surfaces of the non-reciprocal paths 53a and 53b on a positive side in the Y-axis direction. The non-reciprocal members 52c and 52d are in contact with side surfaces of the non-reciprocal paths 53c and 53d on a negative side in the Y-axis direction. The non-reciprocal paths 53a and 53b and the non-reciprocal paths 53c and 53d generate non-reciprocal phase shift amounts of opposite signs due to the difference in position of a side surface to which the non-reciprocal member 52 is joined.

The non-reciprocal member 52a and the non-reciprocal member 52b generate different non-reciprocity due to a difference in length in the X-axis direction. In a case where an identical magnetic field is applied, the non-reciprocal member 52a generates a larger non-reciprocal phase shift amount than the non-reciprocal member 52b. The non-reciprocal member 52c and the non-reciprocal member 52d generate different non-reciprocity due to a difference in length in the X-axis direction. In a case where an identical magnetic field is applied, the non-reciprocal member 52d generates a larger non-reciprocal phase shift amount than the non-reciprocal member 52c. The non-reciprocal member 52a and the non-reciprocal member 52d can have equal lengths. The non-reciprocal member 52b and the non-reciprocal member 52c can have equal lengths.

FIG. 11 is a simplified example in which four second end parts 14 are provided. For example, the number of second end parts 14 may be larger than this and can be, for example, 20, 30, 50, or the like. The second end parts 14 are disposed at a predetermined pitch at equal intervals. All of the second end parts 14 are connected to the non-reciprocal paths 53 having different non-reciprocal phase shift amounts. The non-reciprocal phase shift amounts generated by the non-reciprocal paths 53 can be amounts that regularly differ from one second end part 14 to an adjacent one.

Light input from the first end part 13, propagating through the optical waveguide 12 in the first direction, and output from the second end parts 14 can be caused to have the same phase shift amount, for example, by adjusting lengths of the optical waveguide 12 from the first end part 13 to the second end parts 14. Accordingly, light $L_1$ entering in the X-axis direction from the first end part 13 of the optical isolator 50 has an identical phase when being output from the second end parts 14. Light output from the second port 16 of the optical isolator 50 becomes light $L_2$ having directivity in a narrow angular range in the X-axis direction.

Positions and lengths of the non-reciprocal members 52 are set so that light entering from the second end parts 14, propagating through the optical waveguide 12 in the second direction, and output from the first end part 13 has different predetermined phase differences. For example, in a case where 20 second end parts 14 are arranged at equal intervals in the Y-axis direction, phase shift amounts of the optical waveguide 12 from the second end parts 14 to the first end part 13 can be made different from each other by 10°. In a case where each of the second end parts 14 has a non-reciprocal phase shift amount different from that of an adjacent second end part 14, a wave front of light entering the second end parts 14 that has an identical phase when being output from the first end part 13 is inclined from a direction perpendicular to a direction (i.e., the X-axis direction) in which the optical waveguide 12 extends. Accordingly, the second port 16 has high coupling efficiency with light $L_3$ entering the second port 16 from a predetermined direction inclined from the X-axis direction. Meanwhile, it is difficult for light entering from a direction different from the predetermined direction from which the light $L_3$ enters, to enter the optical isolator 10 from the second port 16.

Figure 12:
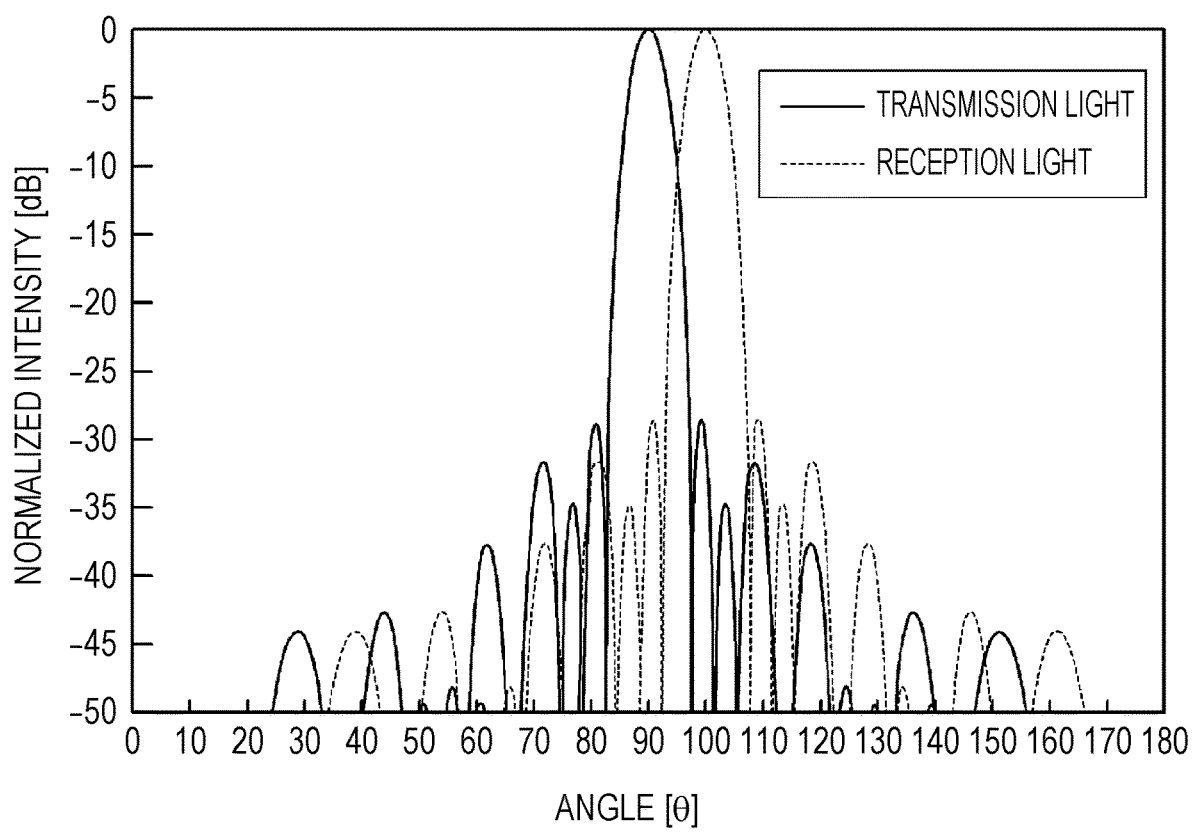
FIG. 12 illustrates intensity distributions, with respect to an angle at a second port, of transmission light and reception light propagating through the optical isolator of FIG. 11.

The solid line in FIG. 12 indicates an angular distribution, at the second port 16, of an intensity of transmission light entering the first port 15, propagating through the optical isolator 50 in the first direction, and transmitted from the second port 16 to an external space. The broken line in FIG. 12 indicates dependency, on an incident angle at the second port 16, of an intensity of reception light entering the second port 16 from an external space, propagating through the optical isolator 50 in the second direction, and output from the first port 15. In FIG. 12, the horizontal axis indicates an angle with respect to the Y-axis direction on the XY plane formed by the X-axis and the Y-axis. The solid line and the broken line each indicate a result obtained by simulation.

In the simulation, it is assumed that the optical isolator 50 has 24 second end parts 14 arranged one-dimensionally in the y-axis direction at a pitch of 750 nm. Furthermore, it is assumed that no phase difference is generated as for light propagating in the first direction from the first end part 13 to the second end parts 14. Conversely, as for light propagating in the second direction from the second end parts 14 to the first end part 13, it is assumed that a phase difference of 10° is generated between light entering from adjacent second end parts. Furthermore, it is assumed that a wavelength of light propagating through the optical isolator 50 is 1500 nm.

According to FIG. 12, an intensity of the transmission light is highest when an angle θ is 90° (i.e., the X-axis direction). A normalized intensity of the transmission light is indicated by dB assuming that the intensity is 0 dB when the angle θ is 90°. An intensity of the reception light is highest when an angle θ of a light beam entering the second port 16 is 100° (i.e., an angle shifted by 10° from the X-axis direction). A normalized intensity of the reception light is indicated by dB assuming that the intensity is 0 dB when the angle θ is 100°.

As is clear from FIG. 12, light entering the optical isolator 50 from the first port 15 and output from the second port 16 has strong directivity in a narrow range close to the angle 90° (the X-axis direction). Meanwhile, light entering the optical isolator 50 from the second port 16 is easiest to enter in a case where the light enters from a narrow range close to the angle 100°. In a case where light enters the optical isolator 50 at an angle 90° (the X-axis direction), an intensity of output light at the first port 15 is smaller by 25 dB or more than in a case where light enters the optical isolator 50 at an angle 100°. The optical isolator 50 thus allows return light travelling in a direction opposite to the light $L_2$ in FIG. 11 to propagate only slightly. For example, in a case where the second port 16 is connected to the optical transmission path 40A or 40B through a space as illustrated in FIGS. 7 and 8 of the first embodiment, return light travels through an optical path substantially opposite to output light and enters the second port 16 in a negative direction of the X-axis. Such return light can only slightly enter the optical isolator 50 from the second port 16.

As described above, the optical isolator 50 according to the present embodiment can realize a function of an optical isolator of allowing propagation of light in the first direction and reducing or suppressing propagation of light in the second direction, as in the first embodiment. Furthermore, the optical isolator 50 is configured such that the second end parts 14 are arranged at a predetermined pitch and phase shift amounts that regularly differ from each other are given between the first end part 13 and the second end parts 14. With this configuration, a direction of light that can enter the second port 16 from an outside is restricted in a narrow direction different from a direction of light output from the second port 16. As a result, entry into the optical isolator 50 and propagation through the optical isolator 50 of return light of light output from the second port 16 can be reduced or suppressed at the second port 16 with more certainty.

Figure 13:
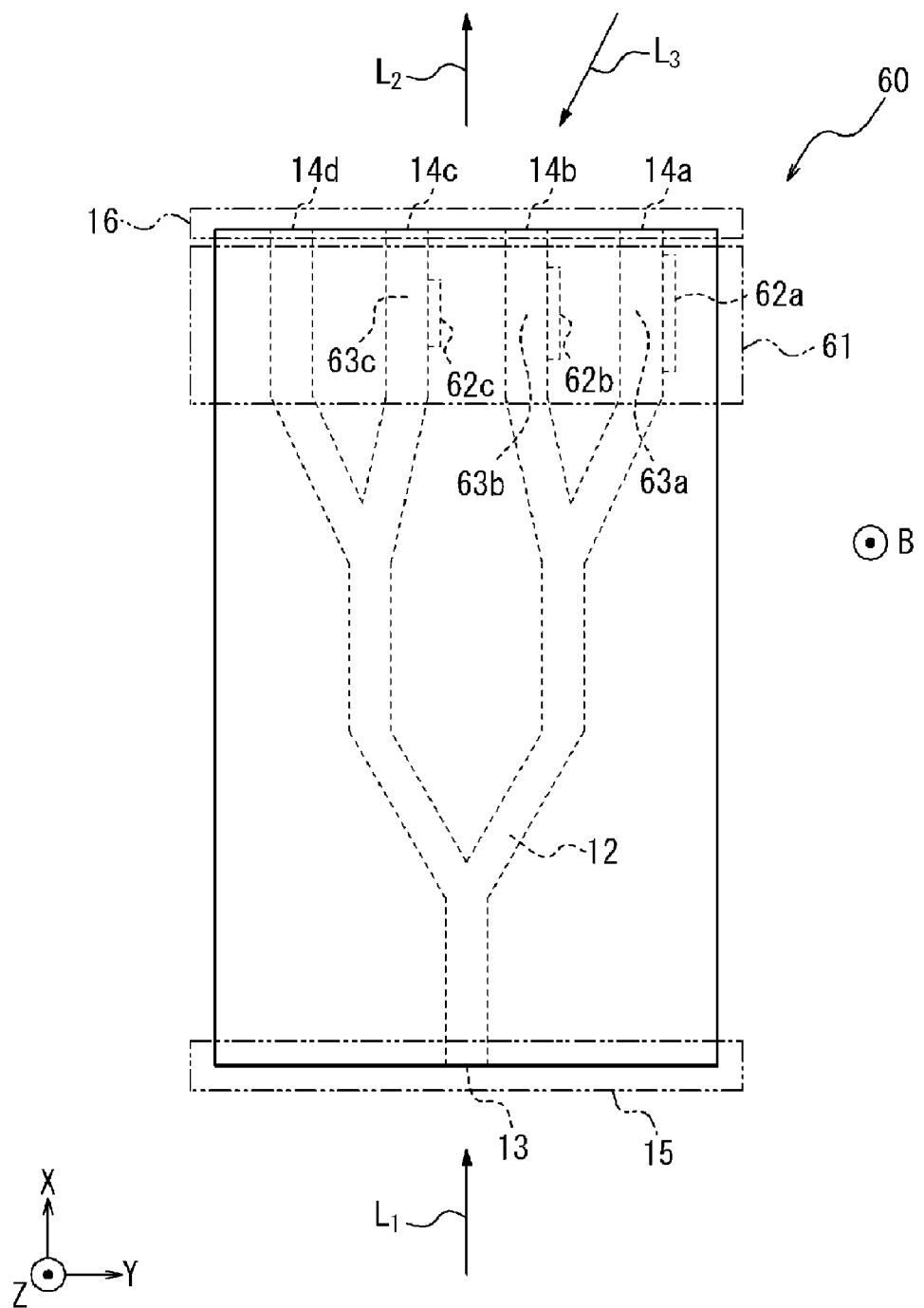
FIG. 13 is a plan view of an optical isolator in which non-reciprocal members are disposed in a way different from FIG. 11.

In FIG. 11, the non-reciprocal members 52a and 52b and the non-reciprocal members 52c and 52d are disposed on different sides, in the Y-axis direction, of the non-reciprocal paths 53, which are part of the optical waveguide 12. It is possible to employ a configuration of an optical isolator 60 illustrated in FIG. 13 in which a phase shifter 61 includes non-reciprocal members 62a to 62c that have different sizes and are disposed only one side of non-reciprocal paths 63a to 63c, which are part of the optical waveguide 12. The non-reciprocal members 62a to 62c are configured to give non-reciprocal phase shift amounts that regularly differ between adjacent ones of the second end parts 14a to 14c. In the example illustrated in FIG. 13, a portion having non-reciprocity is not provided between the first end part 13 and the second end part 14d. Even according to such a configuration, light propagating in the second direction from the plurality of second end parts 14 to the first end part 13 can have different phase differences. This can produce operation and effects similar to those of the optical isolator 50 of FIG. 11.

Third Embodiment

The optical isolators 10, 50, and 60 according to the first embodiment and the second embodiment are configured such that light in the first direction entering from the single first end part 13 and output from the plurality of second end parts 14 is allowed to propagate and light in the second direction opposite to the first direction is not allowed to propagate. However, an optical isolator may also be configured such that light in the second direction is allowed to propagate and light in the first direction is not allowed to propagate. A light source device 71 using such an optical isolator 70 is described with reference to FIGS. 14 and 15.

Figure 14:
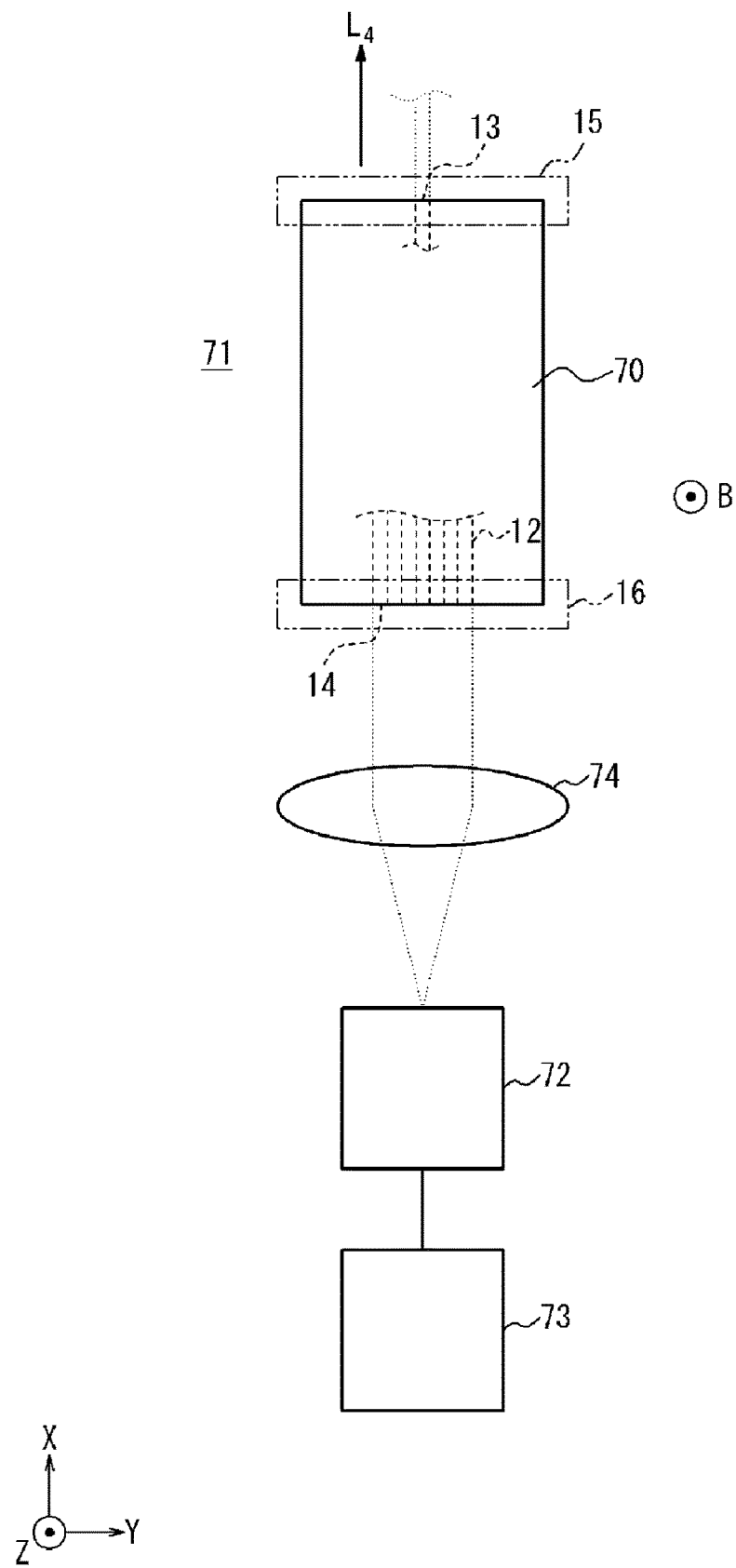
FIG. 14 is a plan view of an optical isolator according to a third embodiment.

As illustrated in FIG. 14, the light source device 71 includes the optical isolator 70, a light source 72 that emits light to be input to the optical isolator 70, a power supply 73 that supplies power to the light source 72, and at least one lens 74 that collimates light from the light source 72 and causes the light to enter a second port 16. The light source 72 can be a semiconductor laser similar to the light source 31 of the light source device 30 according to the first embodiment. In a case where light from the light source 72 is a parallel light beam, the lens 74 need not be provided. Furthermore, a plurality of lenses 74 may be used in combination in order to adjust a beam diameter of light from the light source 72. The light source 72 and the lens 74 may be integrated on a substrate 11 of the optical isolator 70, as in the light source device 30 according to the first embodiment. The light source 72, the power supply 73, and the lens 74 can be constituent elements separable from the optical isolator 70.

Figure 15:
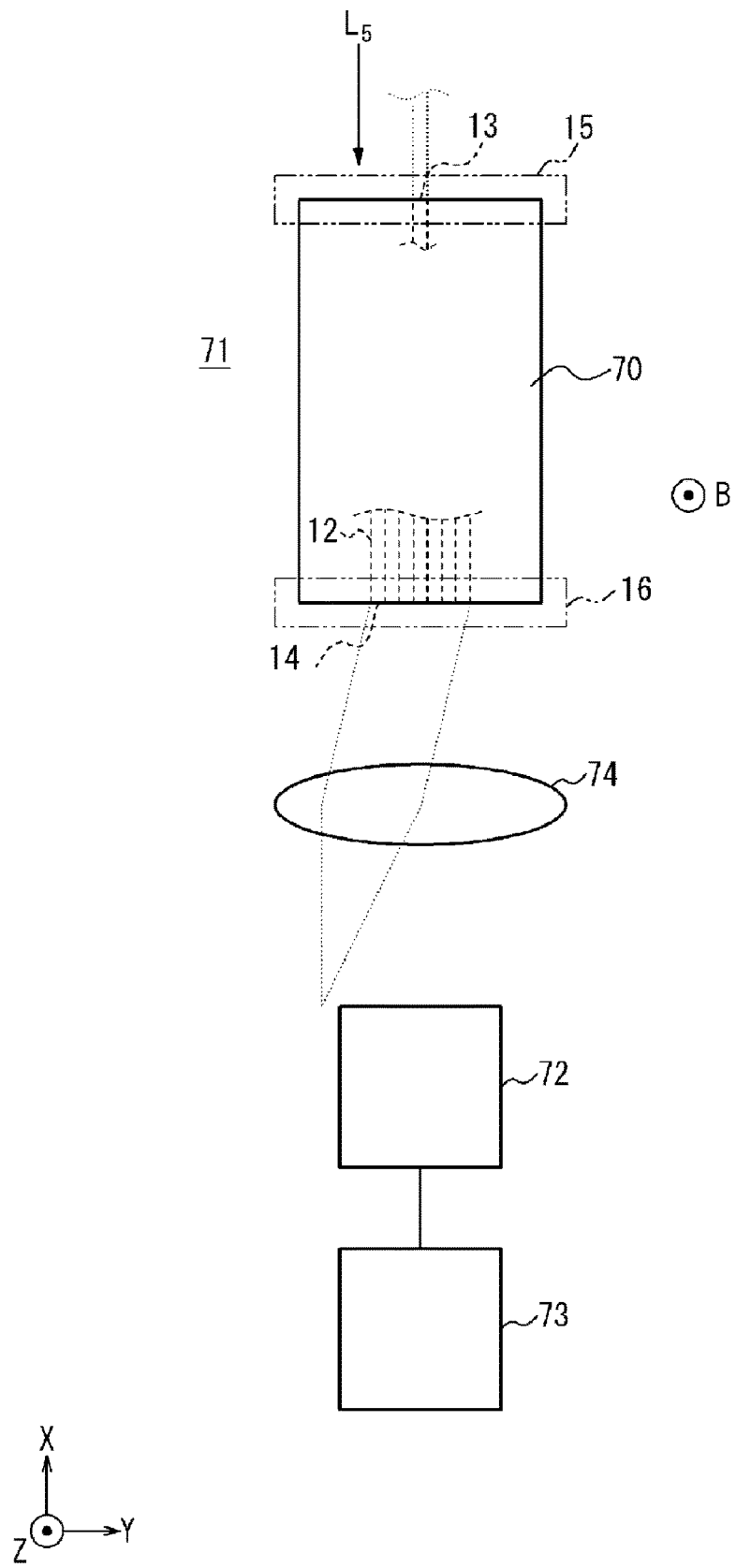
FIG. 15 illustrates a path of return light of the optical isolator of FIG. 14.

The optical isolator 70 is configured such that non-reciprocal phase shift amounts that regularly differ from each other are given between a first end part 13 and second end parts 14, as in the optical isolators 50 and 60 according to the second embodiment. In FIGS. 14 and 15, description of an internal structure of the optical isolator 70 is omitted. Unlike the optical isolators 50 and 60 according to the second embodiment, lengths of the optical waveguide 12 between the first end part 13 and the second end parts 14 of the optical isolator 70 are adjusted so that light of an identical phase input from the second end parts 14 is output from the first end part 13 as light of an identical phase. This allows light emitted from the light source 72 and then collimated to easily enter the second port 16 of the optical isolator 70. That is, the light source 72 and the optical isolator 70 can be easily connected. The light source 72 and the optical isolator 70 can be configured so that coupling efficiency becomes high.

FIG. 14 illustrates a configuration of the light source device 71 and a light beam, indicated by the broken lines, of light emitted from the light source 72 and entering the optical isolator 70 from the second port 16. Light that enters the plurality of second end parts 14 of the second port 16 in the X-axis direction is coupled by passing through the optical waveguide 12 in the optical isolator 70 and is output as light $L_4$ traveling in the X-axis direction from the first end part 13 of the first port 15.

FIG. 15 illustrates a configuration of the light source device 71 and a light beam, indicated by the broken lines, of return light $L_5$ entering the first end part 13 of the first port 15 and returning to the light source device 71. The return light $L_5$ enters the first end part 13 in a negative direction of the X-axis, which is opposite to the traveling direction of the light $L_4$ output from the first end part 13. The return light $L_5$ is divided into a plurality of portions by passing through the optical waveguide 12 in the optical isolator 70 and is then output from the plurality of second end parts 14. Phases of light output from the second end parts 14 regularly differ from each other due to non-reciprocity. For example, phases of light emitted from adjacent ones of the second end parts 14 differ from each other by 10°. Accordingly, the plurality of light portions output from the second end parts 14 are output so that a direction normal to a wave front thereof is inclined from the negative direction of the X-axis. Therefore, the return light $L_5$ travels from the second end parts 14 in a direction inclined with respect to the negative direction of the X-axis and does not enter the light source 72. This makes it possible to prevent the return light $L_5$ of light emitted from the light source 72 from entering the light source 72 and damaging the light source 72, from destabilizing the light source 72, or generating noise or the like due to interference.

Fourth Embodiment

Figure 16:
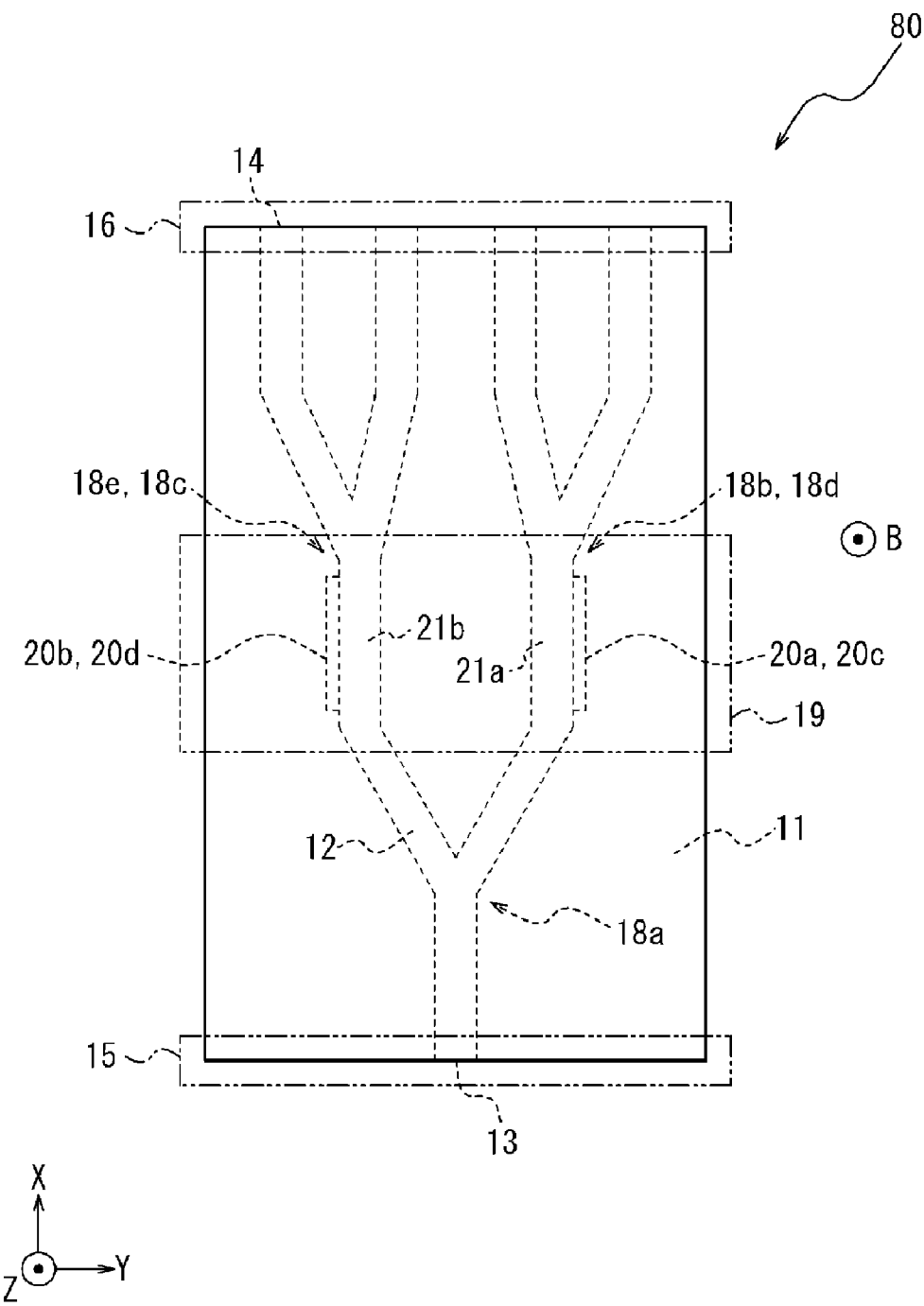
FIG. 16 is a plan view of an optical isolator according to a fourth embodiment.
Figure 17:
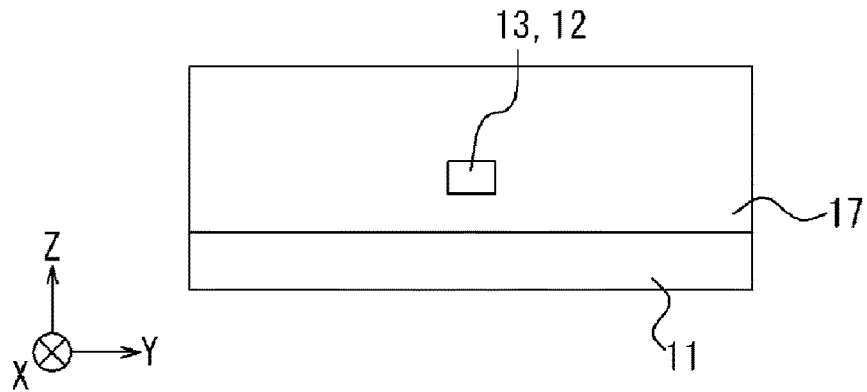
FIG. 17 is a view illustrating the optical isolator of FIG. 16 viewed from a first port side.
Figure 18:
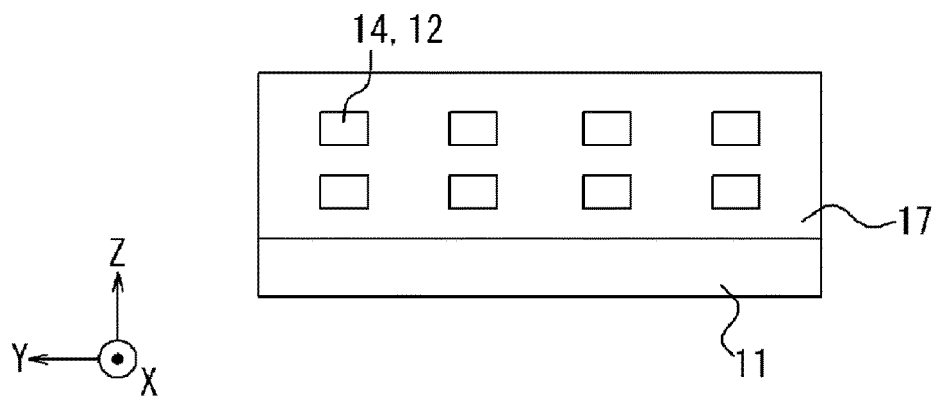
FIG. 18 is a view illustrating the optical isolator of FIG. 16 viewed from a second port side.
Figure 19:
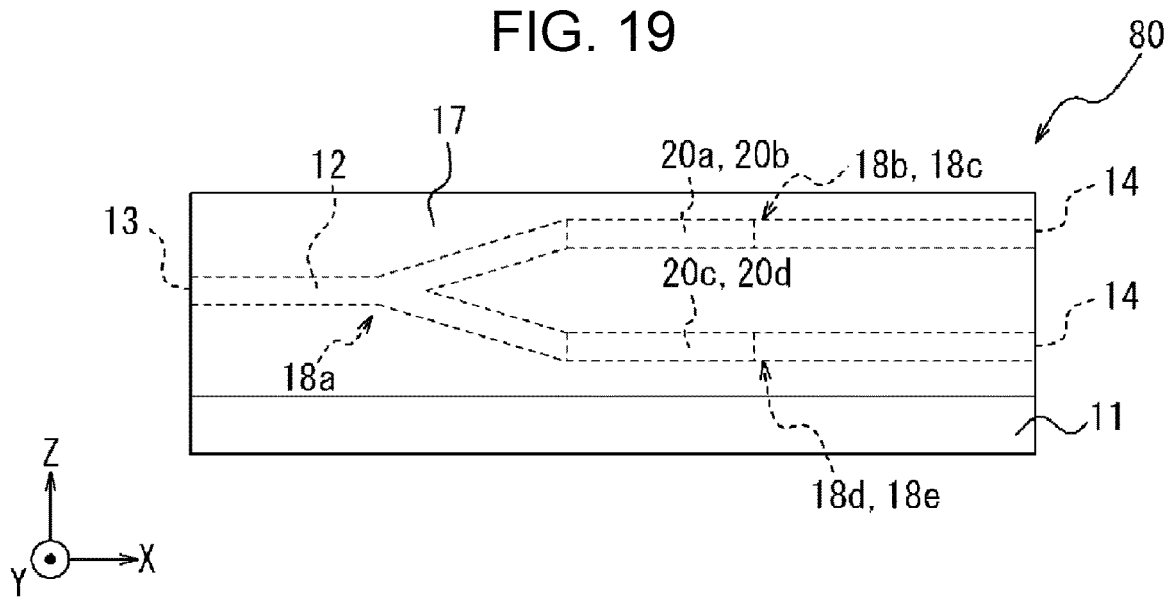
FIG. 19 is a side view of the optical isolator of FIG. 16 viewed so that a first port is located at a left end and a second port is located at a right end.

An optical isolator 80 according to a fourth embodiment is described with reference to FIGS. 16 to 19. FIG. 16 is a plan view of the optical isolator 80. FIG. 17 is a view illustrating the optical isolator 80 viewed from a first port 15 side. FIG. 18 is a view illustrating the optical isolator 80 viewed from a second port 16 side. FIG. 19 is a side view of the optical isolator 80. The optical isolator 80 is partially similar to the optical isolator 10 according to the first embodiment, and constituent elements identical or similar to those of the optical isolator 10 are given identical reference signs, and description thereof is omitted as appropriate.

An optical waveguide 12 of the optical isolator 80 branches not only in the Y-axis direction on the XY plane, but also in the Z-axis direction. The optical waveguide 12 may branch in the Z-axis direction at any position other than at portions in contact with non-reciprocal members 20a to 20d. For example, as illustrated in FIGS. 16 and 19, the optical waveguide 12 may branch into two paths in each of the Y-axis direction and the Z-axis direction, that is, into four paths in total, at a first branching part 18a. Each of the four branch paths of the optical waveguide 12 branching at the first branching part 18a branches into two paths in the Y-axis direction at second to fifth branching parts 18b to 18e. As a result, eight second end parts 14 of the optical waveguide 12 are arranged in two-dimensional arrays in two layers at an end of the optical isolator 80 on the positive side in the X-axis direction, as illustrated in FIG. 18. Furthermore, non-reciprocal members 20a to 20d are disposed in contact between the first branching part 18a and the second to fifth branching parts 18b to 18e, respectively.

The configuration of the optical isolator 80 illustrated in FIGS. 16 to 19 is merely an example. The optical waveguide 12 of the optical isolator 80 may branch into a plurality of optical waveguides 12 in the Y-axis direction and the Z-axis direction which are orthogonal to the X-axis direction, which is a light propagation direction, at a plurality of branching parts 18 disposed at any positions. The number of layers of the second end parts 14 in the Z-axis direction is not limited to two and may be three or more. The number of second end parts 14 is not limited to eight and can be any number.

According to the above configuration, the second end parts 14 are arranged two-dimensionally at the second port 16 of the optical isolator 80. Accordingly, in the optical isolator 80, a larger number of second end parts 14 can be disposed per unit area at the second port 16. For example, in the optical isolator 80, the second end parts 14 can be arranged in arrays of m second end parts 14 in the Y-axis direction and n second end parts 14 in the Z-axis direction (m and n are any integers of two or more). This makes it possible to dispose the second end parts 14 at a density n times as high as that in a case where only m second end parts 14 are arranged in the Y-axis direction in a region of the same area in the optical isolator 10 according to the first embodiment. Accordingly, in a case where light output from the second port 16 of the optical isolator 80 is caused to enter an optical transmission path 40A as in FIG. 7, more light can be caused to enter even in a case where a core having the same diameter is used. Furthermore, in a case where light output from the second port 16 of the optical isolator 80 is coupled with a core 41 of an optical transmission path 40B through a lens 43 as in FIG. 8, a diameter of the lens 43 can be made smaller even in a case where the same number of second end parts 14 are provided. Furthermore, in a case where the second port 16 of the optical isolator 80 is an input side and the first port 15 of the optical isolator 80 is an output side as in the third embodiment, loss of light at the second port 16 can be reduced since the second end parts 14 are provided at a high density at the second port 16.

Fifth Embodiment

An optical isolator 90 according to a fifth embodiment is described with reference to FIGS. 20 to 23. In the drawings, constituent elements identical or similar to those in the fourth embodiment are given identical reference signs.

Figure 20:
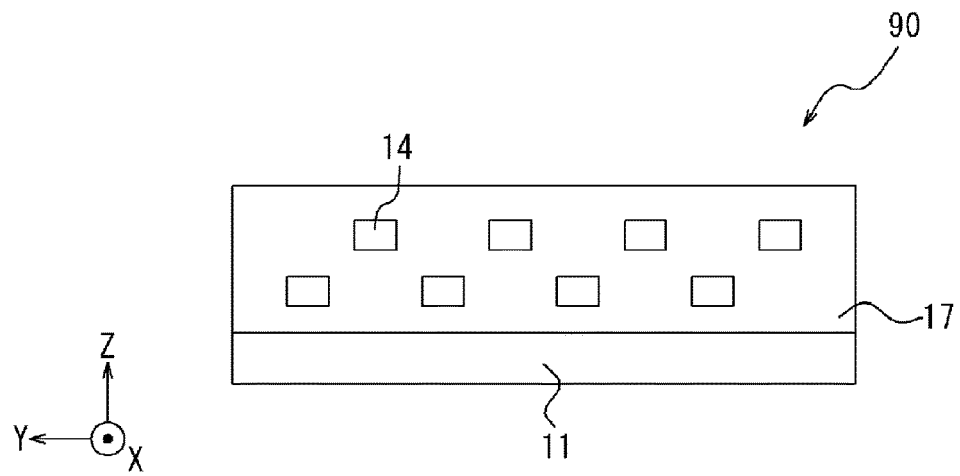
FIG. 20 is a view illustrating an optical isolator according to a fifth embodiment viewed from a second port side.

In the fourth embodiment illustrated in FIG. 18, the plurality of second end parts 14 are arranged in a grid pattern in the Y-axis direction and the Z-axis direction when viewed in the X-axis direction. In the fifth embodiment, an array of second end parts 14 arranged in the Y-axis direction on a positive side in the Z-axis direction and an array of second end parts 14 arranged in the Y-axis direction on a negative side in the Z-axis direction are displaced from each other. That is, the second end parts 14 are displaced in at least one direction from the grid pattern in a two-dimensional direction of the Y-axis direction and the Z-axis direction orthogonal to each other. FIG. 20 illustrates an example of a way in which the second end parts 14 are arranged when viewed from a positive side in the X-axis direction in the fifth embodiment. In a case where the second end parts 14 are arranged in this way, occurrence of interference between upper and lower second end parts can be reduced.

Figure 21:
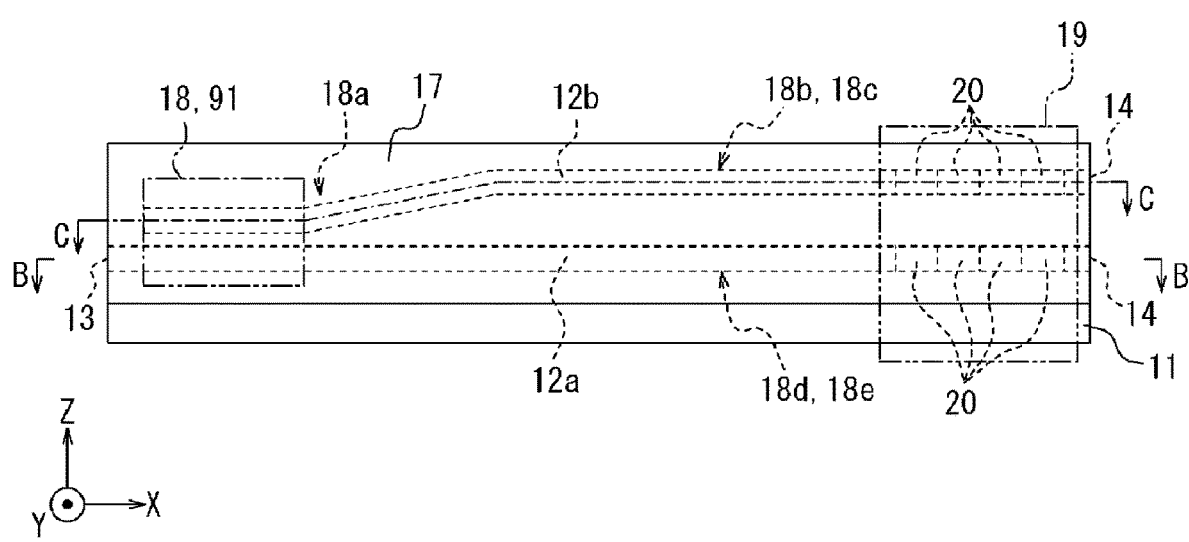
FIG. 21 is a side view of the optical isolator according to the fifth embodiment viewed so that a first port is located at a left end and a second port is located at a right end.
Figure 22:
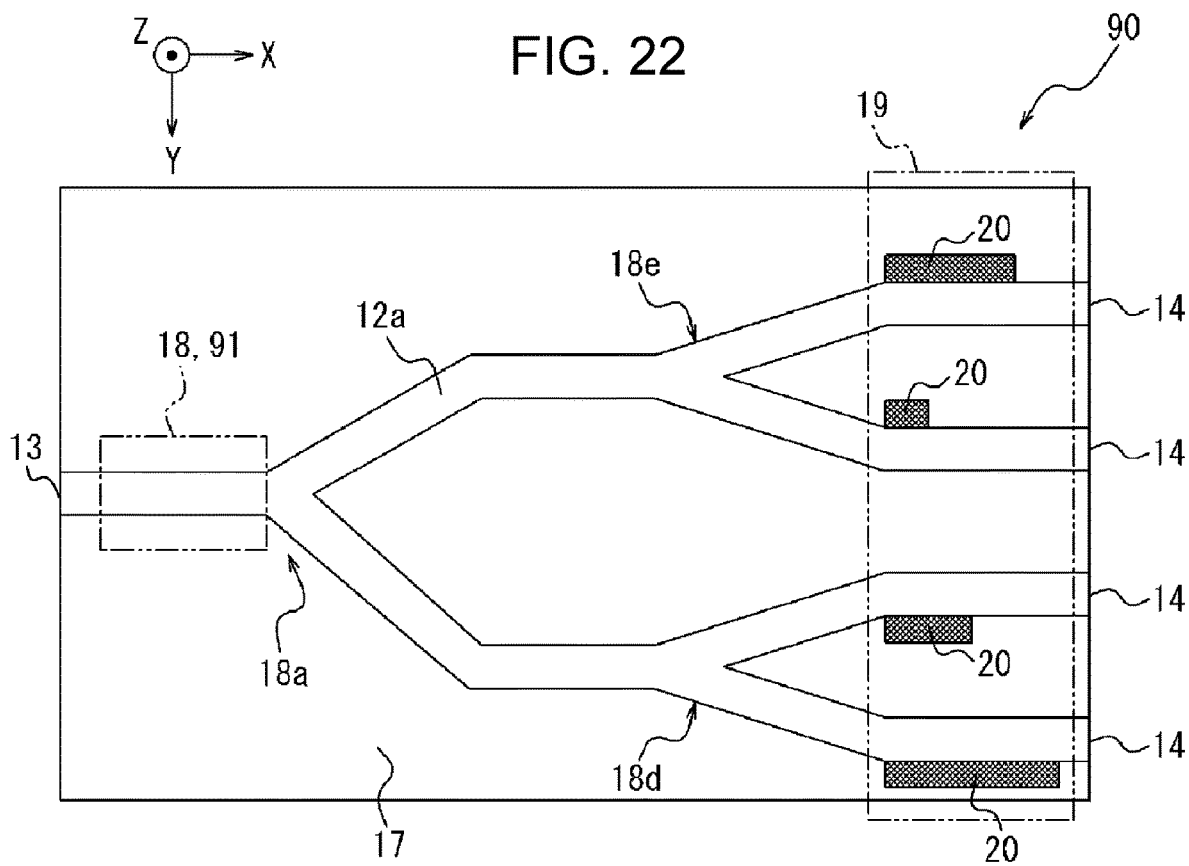
FIG. 22 is a sectional view taken along line B-B of FIG. 21.
Figure 23:
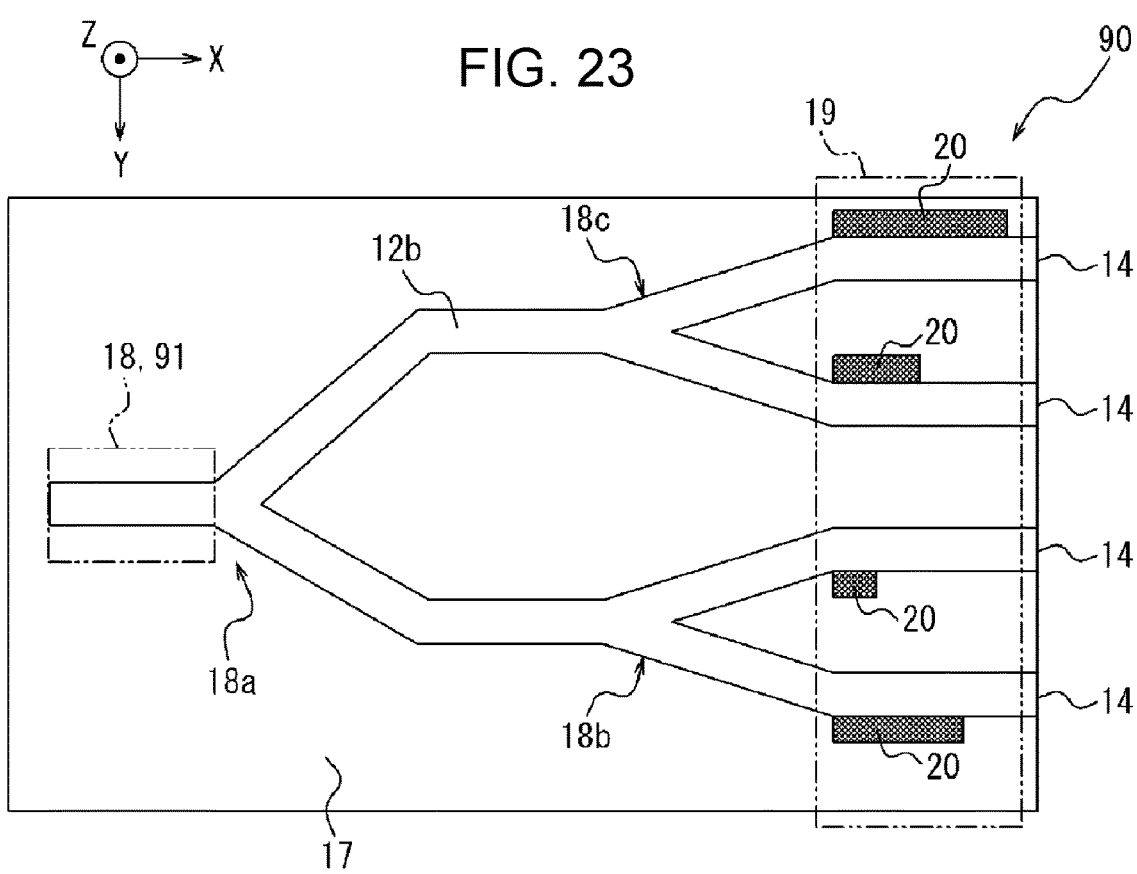
FIG. 23 is a sectional view taken along line C-C of FIG. 21.

As illustrated in FIG. 21, in the present embodiment, a first optical waveguide 12a and a second optical waveguide 12b can be provided as an optical waveguide 12. The first optical waveguide 12a has a first end part 13. The second optical waveguide 12b is coupled to the first optical waveguide 12a by a directional coupler 91 on a first end part 13 side of the optical isolator 90. The directional coupler 91 constitutes one of branching parts 18. As illustrated in FIGS. 22 and 23, the first optical waveguide 12a and the second optical waveguide 12b each branch two times between the directional coupler 91 and four second end parts 14. Accordingly, eight second end parts 14 are arranged in two layers in the Z-axis direction at an end of the optical isolator 90 on a positive side in the X-axis direction. The first optical waveguide 12a and the second optical waveguide 12b have different shapes as illustrated in FIGS. 22 and 23 so that a plurality of second end parts 14 arranged on a positive side in the Z-axis direction and a plurality of second end parts 14 arranged on a negative side in the Z-axis direction are displaced from each other.

Portions of each of the first optical waveguide 12a and the second optical waveguide 12b that lead to the second end parts 14 are a phase shifter 19 having non-reciprocity. The phase shifter 19 has a plurality of non-reciprocal members 20 having non-reciprocity. Each of the non-reciprocal members 20 is disposed in contact with the first optical waveguide 12a or the second optical waveguide 12b. The plurality of non-reciprocal members 20 give different phase shift amounts and therefore have different positions and different lengths in the X direction. The position and the length in the X direction of each of the non-reciprocal members 20 are determined so that a desired phase shift amount is given according to a position of a corresponding second end part 14.

According to the present embodiment, not only effects similar to those of the optical isolator 80 according to the fourth embodiment are obtained, but also occurrence of interference between the plurality of second end parts 14 can be reduced. Note that the number of layers of the second end parts 14 in the Z-axis direction is not limited to two and can be three or more.

It should be noted that the embodiments according to the present disclosure have been described based on the drawings and examples, and various changes or modifications can be easily made based on the present disclosure by a person skilled in the art. It should be noted that such changes or modifications are encompassed within the scope of the present disclosure. The X-axis, Y-axis, and Z-axis are used for convenience of description in the present disclosure and interchangeable with one another.

REFERENCE SIGNS LIST 10 optical isolator
11 substrate
12 optical waveguide
13 first end part
14, 14a, 14b, 14c second end part
15 first port
16 second port
17, 17a, 17b medium
18 branching part
19 phase shifter
20, 20a, 20b non-reciprocal member
21 non-reciprocal path
30 light source device
31 light source
32 power supply
33 lens
40, 40A, 40B optical transmission path
41 core
42 clad
43 lens
50 optical isolator
51 phase shifter
52, 52a to 52d non-reciprocal member
53, 53a to 53d non-reciprocal path
60 optical isolator
61 phase shifter
62, 62a to 62d non-reciprocal member
63, 63a to 63d non-reciprocal path
70 optical isolator
71 light source device
80 optical isolator
90 optical isolator
91 directional coupler

The invention claimed is:

1. An optical isolator comprising:
a substrate; and
an optical waveguide provided on the substrate,
the optical waveguide including:
a first end part,
a plurality of second end parts arranged in an array,
at least one branching part located between the first end part and the plurality of second end parts, and
a portion having non-reciprocity that provides different non-reciprocal phase shift amounts between the first end part and at least two second end parts of the plurality of second end parts,
wherein the plurality of second end parts are arranged at a predetermined pitch, and the different non-reciprocal phase shift amounts regularly differ between adjacent second end parts of the plurality of second end parts.

2. The optical isolator according to claim 1, further comprising a non-reciprocal member disposed in contact with the portion having non-reciprocity of the optical waveguide.

3. The optical isolator according to claim 2, wherein a magnetization direction of the non-reciprocal member or a direction of an external magnetic field generating non-reciprocity in the non-reciprocal member is substantially orthogonal to a polarization direction of incident light entering the optical waveguide.

4. The optical isolator according to claim 2, wherein a magnetization direction of the non-reciprocal member or a direction of an external magnetic field generating non-reciprocity in the non-reciprocal member is substantially perpendicular to a substrate surface of the substrate on which the optical waveguide is provided, and a polarization direction of incident light entering the optical waveguide is substantially parallel with the substrate surface.

5. The optical isolator according to claim 2, wherein a volume of the non-reciprocal member is equal to or less than a half of a volume of the portion having non-reciprocity of the optical waveguide.

6. The optical isolator according to claim 1, wherein the plurality of second end parts are optically coupled to a light source or an optical transmission path with a space interposed therebetween.

7. The optical isolator according to claim 1, wherein the optical waveguide has higher permittivity than permittivity of a medium that is provided in contact with the optical waveguide so as to cover a periphery of the optical waveguide along a direction in which the optical waveguide extends.

8. The optical isolator according to claim 1, wherein the second end parts have an end surface tapered in a longitudinal direction of the optical waveguide.

9. The optical isolator according to claim 1, wherein the plurality of second end parts are arranged in a two-dimensional array.

10. The optical isolator according to claim 9, wherein the second end parts are displaced at least in one direction from a grid pattern in a two-dimensional direction of directions orthogonal to each other.

11. A light source device comprising:
an optical isolator including a substrate and an optical waveguide provided on the substrate, the optical waveguide including a first end part, a plurality of second end parts arranged in an array, a branching part located between the first end part and the plurality of second end parts, and a portion having non-reciprocity, the optical waveguide providing different non-reciprocal phase shift amounts between the first end part and at least two second end parts of the plurality of second end parts, and the plurality of second end parts are arranged at a predetermined pitch, and the different non-reciprocal phase shift amounts regularly differ between adjacent second end parts of the plurality of second end parts; and
a light source disposed so that light emitted from the light source enters the first end part or the plurality of second end parts of the optical isolator.

12. The light source device according to claim 11, further comprising a power supply that supplies power to the light source.

13. An optical isolator comprising:
a substrate; and
an optical waveguide provided on the substrate,
the optical waveguide including:
a first end part,
a plurality of second end parts arranged in an array,
at least one branching part located between the first end part and the plurality of second end parts,
a portion having non-reciprocity that provides different non-reciprocal phase shift amounts between the first end part and at least two second end parts of the plurality of second end parts, and a non-reciprocal member disposed in contact with the portion having non-reciprocity of the optical waveguide, wherein a volume of the non-reciprocal member is equal to or less than a half of a volume of the portion having non-reciprocity of the optical waveguide.

* * * * *